United States Patent
Hustad et al.

(10) Patent No.: US 9,448,483 B2
(45) Date of Patent: Sep. 20, 2016

(54) PATTERN SHRINK METHODS

(71) Applicants: Rohm and Haas Electronic Materials LLC, Marlborough, MA (US); Dow Global Technologies LLC, Midland, MI (US)

(72) Inventors: Phillip D. Hustad, Natick, MA (US); Jong Keun Park, Westborough, MA (US); Jin Wuk Sung, Northborough, MA (US); James Heejun Park, Cambridge, MA (US)

(73) Assignees: Dow Global Technologies LLC, Midland, MI (US); Rohm and Haas Electronic Materials LLC, Marlborough, MA (US)

( * ) Notice: Subject to any disclaimer, the term of this patent is extended or adjusted under 35 U.S.C. 154(b) by 0 days.

(21) Appl. No.: 14/726,238

(22) Filed: May 29, 2015

(65) Prior Publication Data
US 2016/0033869 A1 Feb. 4, 2016

Related U.S. Application Data

(60) Provisional application No. 62/031,718, filed on Jul. 31, 2014.

(51) Int. Cl.
*H01L 21/31* (2006.01)
*G03F 7/32* (2006.01)
(Continued)

(52) U.S. Cl.
CPC ............... *G03F 7/325* (2013.01); *G03F 7/20* (2013.01); *G03F 7/38* (2013.01); *G03F 7/40* (2013.01); *H01L 21/0273* (2013.01); *H01L 21/0276* (2013.01)

(58) Field of Classification Search
CPC .................................. H01L 21/31058
USPC ................................. 438/950, 952
See application file for complete search history.

(56) References Cited

U.S. PATENT DOCUMENTS 6,638,441 B2 * 10/2003 Chang .................. C23F 1/02
438/952
7,553,610 B2 6/2009 Kaneko et al.
(Continued)

FOREIGN PATENT DOCUMENTS

WO 2013065878 A1 5/2013
WO 2014127430 A1 8/2014
(Continued)

OTHER PUBLICATIONS

Oyama, et al, "The enhanced photoresist shrink process technique toward 22nm node", Proc. of SPIE, vol. 7972, 2011, pp. 79722Q-1-6.
(Continued)

*Primary Examiner* — Chandra Chaudhari
(74) *Attorney, Agent, or Firm* — Jonathan D. Baskin

(57) ABSTRACT

Pattern shrink methods comprise: (a) providing a semiconductor substrate comprising one or more layers to be patterned; (b) providing a resist pattern over the one or more layers to be patterned; (c) coating a shrink composition over the pattern, wherein the shrink composition comprises a polymer and an organic solvent, wherein the polymer comprises a group containing a hydrogen acceptor effective to form a bond with an acid group and/or an alcohol group at a surface of the resist pattern, and wherein the composition is free of crosslinkers; and (d) rinsing residual shrink composition from the substrate, leaving a portion of the polymer bonded to the resist pattern. Also provided are pattern shrink compositions, and coated substrates and electronic devices formed by the methods. The invention find particular applicability in the manufacture of semiconductor devices for providing high resolution patterns.

36 Claims, 14 Drawing Sheets

(51) Int. Cl.
  *G03F 7/20* (2006.01)
  *G03F 7/38* (2006.01)
  *G03F 7/40* (2006.01)
  *H01L 21/027* (2006.01)

(56) References Cited

U.S. PATENT DOCUMENTS

| | | | |
|---|---|---|---|
| 7,745,077 | B2 | 6/2010 | Thiyagarajan et al. |
| 9,034,762 | B2 * | 5/2015 | Hong ............... H01L 21/308 438/950 |
| 9,360,760 | B2 * | 6/2016 | Hatakeyama ....... H01L 21/0274 |
| 2010/0239984 | A1 | 9/2010 | Tsubaki et al. |
| 2011/0147983 | A1 | 6/2011 | Cheng et al. |
| 2013/0210231 | A1 | 8/2013 | Senzaki et al. |
| 2013/0240481 | A1 | 9/2013 | Senzaki et al. |
| 2014/0242359 | A1 | 8/2014 | Nakamura et al. |
| 2015/0086929 | A1 | 3/2015 | Hatakeyama et al. |
| 2015/0118852 | A1 | 4/2015 | Lee et al. |
| 2015/0338744 | A1 | 11/2015 | Hatakeyama et al. |

FOREIGN PATENT DOCUMENTS

| | | |
|---|---|---|
| WO | 2014163332 A1 | 10/2014 |
| WO | 2015037467 A1 | 3/2015 |

OTHER PUBLICATIONS

Cheng, et al, "EUVL Compatible, LER Solutions using Functional Block Copolymers", Proc. of SPIE vol. 8323, 2012, pp. 832310-1-11.

Namie, et al, "Polymer blends for directed self-assembly," Proc. of SPIE, vol. 8680, 2013, pp. 86801M-1-5.

Ya-Mi Chuang, et al, "Using Directed Self Assembly of Block Copolymer Nanostructures to Modulate Nanoscale Surface Roughness: Towards a Novel Lithographic Process", Advanced Functional Materials, 2013, pp. 173-183, vol. 23.

Ya-Mi Chuang, "Healing LER using directed self assembly: treatment of EUVL resists with aqueous solutions of block copolymers", Proc. of SPIE, 2013, pp. 868009-1 to 868009-10, vol. 8680.

* cited by examiner

| Before shrink | SC-1 After shrink | SC-2 After shrink | SC-3 After shrink |
|---|---|---|---|
| CD = 62.4 nm | CD = 54.3 nm | CD = 57.2 nm | CD = 24.7 nm |

FIG. 13

PATTERN SHRINK METHODS

CROSS-REFERENCE TO RELATED APPLICATIONS

This application claims the benefit of priority under 35 U.S.C. §119(e) to U.S. Provisional Application No. 62/031,718, filed Jul. 31, 2014, the entire contents of which are incorporated herein by reference.

FIELD OF THE INVENTION

The invention relates generally to the manufacture of electronic devices. More specifically, this invention relates to photolithographic methods which allow for the formation of fine patterns using a pattern shrink process. The invention finds particular applicability in the semiconductor manufacturing industry.

BACKGROUND OF THE INVENTION

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer range, photoresists and photolithography processing tools having high-resolution capabilities have been and continue to be developed.

Positive-tone chemically amplified photoresists are conventionally used for high-resolution processing using a positive tone development (PTD) process. In the PTD process, exposed regions of a photoresist layer are soluble in a developer solution, typically an aqueous alkaline developer, and are removed from the substrate surface, whereas unexposed regions which are insoluble in the developer remain after development to form a positive image. To improve lithographic performance, immersion lithography tools have been developed to effectively increase the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer.

Considerable effort has been made to extend the practical resolution beyond that achieved with positive tone development from both a materials and processing standpoint. One such example is the negative tone development (NTD) process. The NTD process allows for improved resolution and process window as compared with standard positive tone imaging by making use of the superior imaging quality obtained with bright field masks for printing critical dark field layers. NTD resists typically employ a resin having acid-labile (also referred to herein as acid-cleavable) groups and a photoacid generator. Exposure to actinic radiation causes the photoacid generator to form an acid which, during post-exposure baking, causes cleavage of the acid-labile groups giving rise to a polarity switch in the exposed regions. As a result, a difference in solubility characteristics is created between exposed and unexposed regions of the resist such that unexposed regions of the resist can be removed by organic solvent developers, leaving behind a pattern created by the insoluble exposed regions.

To further extend resolution capabilities beyond those typically obtained with standard resist patterning techniques, various processes for pattern shrink have been proposed. These processes involve increasing the effective thickness of the resist pattern sidewalls to reduce (i.e., "shrink") the spacing, for example, between adjacent lines or within a trench or hole pattern. In this way, features such as trenches and contact holes formed from the patterns can be made smaller. Known shrink techniques include, for example, chemical vapor deposition (CVD) assist, acid diffusion resist growth and polymer blend self-assembly.

The CVD assist shrink process (see K. Oyama et al, "The enhanced photoresist shrink process technique toward 22 nm node", *Proc. SPIE* 7972, Advances in Resist Materials and Processing Technology XXVIII, 79722Q (2011)), uses a CVD-deposited layer formed over a photoresist pattern including, for example, contact hole, line/space or trench patterns. The CVD material is etched back, leaving the material on sidewalls of the resist pattern. This increases the effective lateral dimensions of the resist pattern, thereby reducing the open areas that expose the underlying layer to be etched. The CVD assist shrink technique requires use of CVD and etching tools which are costly, add to the complexity of the process and are disadvantageous in terms of process throughput.

In the acid diffusion resist growth process, also referred to as the RELACS process (see L. Peters, "Resists Join the Sub-λ Revolution", *Semiconductor International,* 1999. 9), an acid-catalyzed crosslinkable material is coated over a PTD-generated resist patterned surface. Crosslinking of the material is catalyzed by an acid component present in the resist pattern that diffuses into the crosslinkable material during a baking step. The crosslinking takes place in the material in the vicinity of the resist pattern in the acid diffusion region to form a coating on sidewalls of the pattern, thereby reducing the lateral dimension of open areas of the pattern. This process typically suffers from iso-dense bias (IDB), wherein growth of the crosslinked layer on the resist pattern occurs non-uniformly across the die surface depending on density (spacing between) adjacent resist patterns. As a result, the extent of "shrink" for identical features can vary across die based on pattern density. This can lead to patterning defects and variations in electrical characteristics across the die for what are intended to be identical devices.

Polymer blend self-assembly (see Y. Namie et al, "Polymer blends for directed self-assembly", *Proc. SPIE* 8680, Alternative Lithographic Technologies V, 86801M (2013)) involves coating a composition containing an immiscible blend of hydrophilic and hydrophobic polymers over the photoresist pattern. The composition is then annealed, causing the polymers to phase separate, wherein the hydrophilic polymer preferentially segregates to the resist pattern sidewalls and the hydrophobic polymer fills the remainder of the volume between the resist pattern sidewalls. The hydrophobic polymer is next removed by solvent development, leaving the hydrophilic polymer on the resist pattern sidewalls. Polymer blend self-assembly has been found to suffer from proximity and size effects. As the shrink ratio is determined by the volume ratio of the two polymers, all features shrink by the same relative percentage rather than by the same absolute amount. This can lead to the same problems described with respect to the acid diffusion resist growth technique.

There is a continuing need in the art for improved photoresist pattern shrink methods which address one or more problems associated with the state of the art and which allow for the formation of fine patterns in electronic device fabrication.

SUMMARY

In accordance with one aspect of the invention, pattern shrink methods are provided. The methods comprise: (a) providing a semiconductor substrate comprising one or more layers to be patterned; (b) providing a resist pattern over the one or more layers to be patterned; (c) coating a shrink composition over the pattern, wherein the shrink composition comprises a polymer and an organic solvent, wherein the polymer comprises a group containing a hydrogen acceptor effective to form a bond with an acid group and/or an alcohol group at a surface of the resist pattern, and wherein the composition is free of crosslinkers; and (d) rinsing residual shrink composition from the substrate, leaving a portion of the polymer bonded to the resist pattern. The methods find particular applicability in the manufacture of semiconductor devices for providing high resolution patterns.

Preferably, the resist pattern is formed by a negative tone development process. An exemplary such process comprises: (b1) applying a layer of a photoresist composition over the one or more layers to be patterned, wherein the photoresist composition comprises: a polymer comprising an acid cleavable leaving group, the cleavage of which forms an acid group and/or an alcohol group; a photoacid generator; and a solvent; (b2) exposing the photoresist layer to activating radiation through a patterned photomask; (b3) heating the photoresist layer, wherein acid generated by the acid generator causes cleavage of the acid cleavable leaving group, thereby forming the acid group and/or the alcohol group; and (b4) developing the exposed photoresist composition layer with an organic solvent developer to form a negative resist pattern comprising the acid group and/or the alcohol group.

Also provided are shrink compositions, as well as coated substrates and electronic devices formed by the methods described herein.

The terminology used herein is for the purpose of describing particular embodiments only and is not intended to be limiting of the invention. As used herein, the singular forms "a", "an" and "the" are intended to include both singular and plural forms, unless the context clearly indicates otherwise. Reference to specific glass transition temperatures ($T_g$) are as measured by differential scanning calorimetry.

BRIEF DESCRIPTION OF THE DRAWINGS

The present invention will be described with reference to the following drawings, in which like reference numerals denote like features, and in which:

FIG. 13 shows SEM images before and after a shrink method in accordance with the invention.

DETAILED DESCRIPTION

Shrink Compositions

Figure 1A:
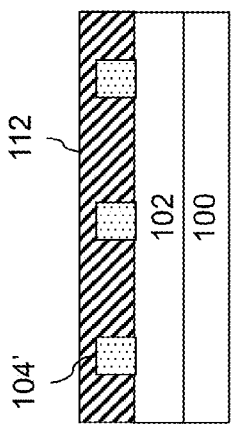
FIG. 1A-F is a process flow for a shrink process in accordance with the invention.

The shrink compositions of the invention include a polymer and a solvent, and can include one or more additional, optional components. The shrink compositions, when coated over a photoresist pattern, for example, contact hole, trench or line and space patterns, allow for a consistent shrink value regardless of feature size or density. That is, the compositions allow for a shrink pattern with minimal or no proximity bias to be obtained. In addition, the shrink compositions can be coated using a spin-coating tool, thereby allowing for simplified processing and ease in integration with the photoresist patterning process.

Suitable polymers for the shrink compositions include, for example, random copolymers and block copolymers (BCPs). The random copolymers can include two, three, four or more different units. The block copolymers can be multiblock copolymers. The multiblocks can include, for example, diblocks, triblocks, tetrablocks, or more blocks. The blocks can be part of a linear copolymer, a branched copolymer where the branches are grafted onto a backbone (these copolymers are also sometimes called "comb copolymers"), a star copolymer, and the like. The polymer is capable of adhering to an NTD-formed photoresist pattern, for example, by bonding with an acid and/or alcohol group present on the resist pattern as a result of deprotection during the resist patterning process. The polymer preferably has a "sticky" component that anchors the polymer to the deprotected group of the resist pattern, and a "smoothing" component which allows for the formation of a smooth surface. The sticky and smoothing components are typically on different blocks of a block copolymer or in different units of a random copolymer.

The sticky component of the polymer preferably includes a group containing a hydrogen acceptor effective to form a bond, preferably an ionic or hydrogen bond, with a deprotected acid group and/or alcohol group at a surface of the resist pattern. The group containing the hydrogen acceptor can be, for example, a nitrogen-containing group or an oxygen-containing group. Suitable nitrogen-containing groups can form an ionic bond with an acid group at the surface of the resist pattern. Useful nitrogen-containing groups include, for example, amine groups and amide groups, for example, primary amines including alkyl amines such as N-methylamine, N-ethylamine, N-t-butylamine, and the like, secondary amines including N,N-dialkylamines such as N,N-dimethylamine, N,N-methylethylamine, N,N-diethylamine tertiary amines, and the like, and tertiary amines such as trimethylamine. Useful amide groups include alkylamides such as N-methylamide, N-ethylamide, N-phenylamide, N,N-dimethylamide, and the like. The nitrogen-containing groups can also be part of a ring, such as pyridine, indole, imidazole, triazine, pyrrolidine, azacyclopropane, azacyclobutane, piperidine, pyrrole, purine, diazetidine, dithiazine, azocane, azonane, quinoline, carbazole, acridine, indazole, benzimidazole, and the like.

Suitable oxygen-containing groups can form a hydrogen bond with a deprotected alcohol group at the surface of the resist pattern. Useful oxygen-containing groups include, for example, ether and alcohol groups. Suitable alcohols include, for example, primary hydroxyl groups such as hydroxymethyl, hydroxyethyl, and the like; secondary hydroxyl groups such as 1-hydroxyethyl, 1-hydroxypropyl, and the like; and tertiary alcohols such as 2-hydroxypropan-2-yl, 2-hydroxy-2-methylpropyl, and the like; and phenol derivatives such as 2-hydroxybenzyl, 3-hydroxybenzyl, 4-hydroxybenzyl, 2-hydroxynaphthyl, and the like. Useful ether groups include, for example, methoxy, ethoxy, 2-methoxyethoxy, and the like. Other useful oxygen-containing groups include diketone functionalities such as pentane-2,4-dione, and ketones such as ethanone, butanone, and the like.

Suitable monomer units for the sticky component include, for example, 2-(N,N-dimethylamino)ethyl methacrylate, 2-(N,N-dimethylamino)ethyl acrylate, 2-(tert-butylamino)ethyl methacrylate, 2-N-morpholinoethyl acrylate, 2-N-morpholinoethyl methacrylate, 3-dimethylaminoneopentyl acrylate, N-(t-BOC-aminopropyl) methacrylamide, N-[2-(N,N-dimethylamino)ethyl]methacrylamide, N-[3-(N,N-dimethylamino)propyl]acrylamide, N-[3-(N,N-dimethylamino)propyl]methacrylamide, 2-vinylpyridine, 4-vinylpyridine, N-(3-aminopropyl)methacrylamide, 2-aminoethyl methacrylate, 2-(dimethylamino)styrene, 4-(dimethylamino)styrene, 2-vinylpyridine, 4-vinylpyridine, and N-vinylpyrrolidone. When the material is based on polysiloxane chemistry, the sticky component typically includes an amine-functional siloxane monomer, such as n-(acetylglycyl)-3-aminopropyltrimethoxysilane, 3-(n-allylamino)propyltrimethoxysilane, allylaminotrimethylsilane, 4-aminobutyltriethoxysilane, 4-amino-3,3-dimethylbutylmethyldimethoxysilane, 4-amino-3,3-dimethylbutyltrimethoxysilane, n-(2-aminoethyl)-3-aminoisobutyldimethylmethoxysilane, n-(2-aminoethyl)-3-aminoisobutylmethyldimethoxysilane, (aminoethylaminomethyl)phenethyltrimethoxysilane, n-(2-aminoethyl)-3-aminopropylmethyldiethoxysilane, n-(2-aminoethyl)-3-aminopropylmethyldimethoxysilane, n-(2-aminoethyl)-3-aminopropyltriethoxysilane, n-(2-aminoethyl)-3-aminopropyltrimethoxysilane, n-(2-aminoethyl)-2,2,4-trimethyl-1-aza-2-silacyclopentane, n-(6-aminohexyl)aminomethyltriethoxysilane, n-(6-aminohexyl)aminomethyltrimethoxysilane, n-(2-aminoethyl)-11-aminoundecyltrimethoxysilane, 3-(m-aminophenoxy)propyltrimethoxysilane, m-aminophenyltrimethoxysilane, p-aminophenyltrimethoxysilane, n-3-[amino(polypropylenoxy)]aminopropyltrimethoxysilane, 3-aminopropylmethyldiethoxysilane, 3-aminopropyltriethoxysilane, 3-aminopropyltrimethoxysilane, 11-aminoundecyltriethoxysilane, n-(2-n-benzylaminoethyl)-3-aminopropyltrimethoxysilane, n-butylaminopropyltrimethoxysilane, t-butylaminopropyltrimethoxysilane, (n-cyclohexylaminomethyl)triethoxysilane, (n-cyclohexylaminomethyl)trimethoxysilane, (n,n-diethyl-3-aminopropyl)trimethoxysilane, n,n-dimethyl-3-aminopropylmethyldimethoxysilane, (n,n-dimethyl-3-aminopropyl)trimethoxysilane, (3-(n-ethylamino)isobutyl)trimethoxysilane, n-methylaminopropylmethyldimethoxysilane, n-methylaminopropyltrimethoxysilane, (phenylaminomethyl)methyldimethoxysilane, n-phenylaminopropyltrimethoxysilane, and the like.

The smoothing component preferably has a $T_g$ such that it can flow during post-exposure bake to form a smooth surface by minimizing its surface area with air. The $T_g$ is preferably lower than a reflow temperature of the underlying resist pattern. With this property, the shrink compositions can provide improved line edge and circularity roughness, resulting in smoother lines and more circular holes. While the desired $T_g$ will depend on the underlying photoresist pattern, the smoothing component typically has a $T_g$ of from −140 to 160° C., for example, from −125 to 130° C. Suitable materials for the smoothing component of the polymer include, for example, poly(t-butylmethacrylate), poly(methylmethacrylate), poly(ethylmethacrylate), poly(propylmethacrylate), polystyrene, polyethylene, polydimethylsiloxane, and the like.

Suitable materials for the smoothing component of the polymer include vinyl aromatic monomers, acrylate monomers, (alkyl)acrylate monomers, polysiloxanes, poly(dimethylsilabutane)s, or combinations thereof. Suitable vinyl aromatic monomers for the smoothing component include styrene, o-methylstyrene, p-methylstyrene, m-methylstyrene, α-methylstyrene, ethylstyrene, α-methyl-p-methylstyrene, 2,4-dimethylstyrene, monochlorostyrene, 4-tert-butylstyrene, or the like, or a combination comprising at least one of the foregoing alkylstyrene monomers. The vinyl aromatic monomers can also include pendent silicon atoms as represented by formula (1):

(1)

wherein $R_1$ is $SiR_2$ where $R_2$ is a $C_1$-$C_{10}$ alkyl, $OSiMe_2SiMe_3$, $O(SiMe_2)_2SiMe_3$, $SiMe_2SiMe_3$, $(SiMe_2)_2SiMe_3$, or the like. Exemplary styrene monomers that include pendent silicon atoms are shown in formulas (2)-(4):

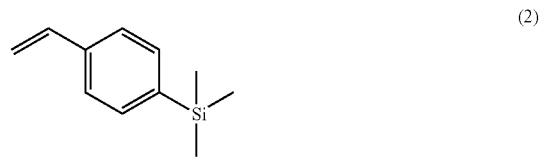

(2)

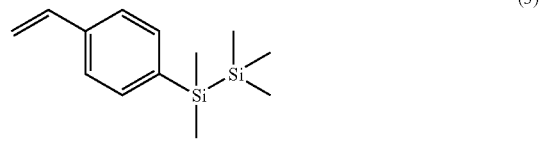

(3)

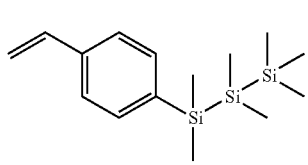

(4)

Suitable acrylate monomers for the smoothing component can have a structure derived from a monomer represented by formula (5):

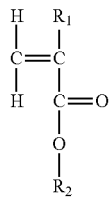

(5)

wherein $R_1$ is a hydrogen or an alkyl group having 1 to 10 carbon atoms and $R_2$ is a $C_1$-$C_{10}$ alkyl, a $C_3$-$C_{10}$ cycloalkyl, or a $C_7$-$C_{10}$ aralkyl group. Examples of the (alkyl)acrylates are methacrylate, ethacrylate, propyl acrylate, methyl methacrylate, methyl ethylacrylate, methyl propylacrylate, ethyl ethylacrylate, methyl arylacrylate, and the like, or a combination comprising at least one of the foregoing acrylates. The term "(meth)acrylate" implies that either an acrylate or methacrylate is contemplated unless otherwise specified. Exemplary examples of acrylate monomers for the smoothing component are poly(t-butylmethacrylate), poly(methylmethacrylate), poly(ethylmethacrylate), poly(propylmethacrylate).

The acrylate monomers can also include pendent silicon atoms as represented by the formula (6):

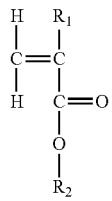

(6)

wherein $R_2$ contains silicon, for example, $R_2$=$SiR_3$ wherein $R_3$ is a $C_1$-$C_{10}$ alkyl, $OSiMe_2SiMe_3$, $O(SiMe_2)_2SiMe_3$, $SiMe_2SiMe_3$, $(SiMe_2)_2SiMe_3$, $CH_2SiMe_3$, $CH(SiMe_3)_2$, or the like. Exemplary acrylate monomers including pendent silicon atoms are shown in formulas (7)-(14):

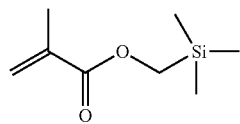

(7)

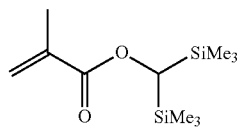

(8)

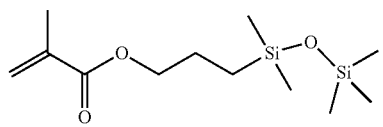

(9)

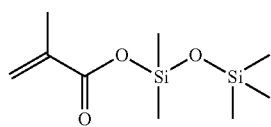

(10)

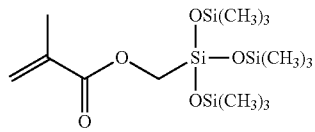

(11)

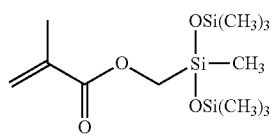

(12)

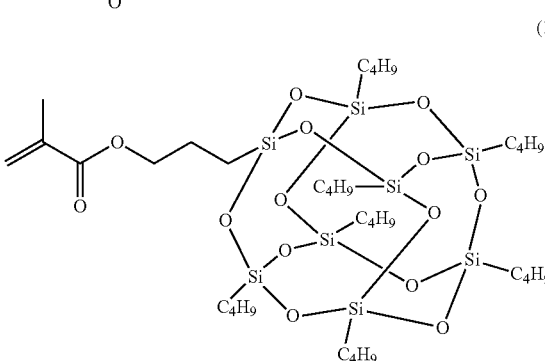

(13)

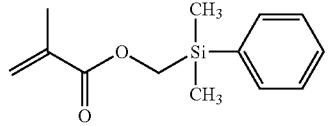

(14)

The smoothing component can also comprise polysiloxanes derived from a siloxane monomer and having a repeating unit with the structure of formula (15):

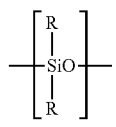

(15)

wherein each R is independently a $C_1$-$C_{10}$ alkyl, a $C_3$-$C_{10}$ cycloalkyl, a $C_6$-$C_{14}$ aryl, a $C_7$-$C_{13}$ alkylaryl or a $C_7$-$C_{13}$ arylalkyl. Combinations of the foregoing R groups can be present in the same monomer. Exemplary siloxanes include dimethylsiloxane, diethylsiloxane, diphenylsiloxanes, and combinations thereof.

By selection of a suitable polymer, the amount of growth of the shrink polymer on the resist pattern sidewall can be accurately controlled. This thickness can be controlled, for example, by selection of a suitable molecular weight, with higher molecular weights resulting in greater thicknesses and vice-versa. The chemical composition of the shrink polymer can also influence the amount of growth. For example, polymers with a longer unperturbed end-to-end distance or characteristic ratio provide larger shrink for a given molecular weight.

The polymer should have good solubility in an organic solvent used in the composition and an organic solvent used to rinse and completely remove excess polymer (i.e., polymer not attached to the resist pattern) from the substrate. The content of the polymer in the shrink compositions will depend, for example, on the desired coating thickness of the shrink composition. The polymer is typically present in the compositions in an amount of from 80 to 99 wt %, more typically from 90 to 98 wt %, based on total solids of the shrink composition. The weight average molecular weight of the polymer is typically less than 400,000, preferably from 5000 to 200,000, more preferably from 1000 to 125,000 g/mol.

The polymer preferably has good etch resistance to facilitate pattern transfer. For carbon based polymers, the "Ohnishi parameter" can generally be used as an indicator of etch resistance of a polymer (J. Electrochem Soc, 143, 130 (1983), H. Gokan, S. Esho and Y. Ohnishi). The Ohnishi parameter is used in general to indicate the carbon density of a polymer and is specifically determined by the equation described in Formula (16):

$$N/(NC-NO)=\text{Ohnishi parameter} \quad (16)$$

where N is the combined total number of carbon atoms, hydrogen atoms and oxygen atoms, NC is the number of carbon atoms, and NO is the number of oxygen atoms. The increase of the carbon density of a polymer per unit volume (i.e., the decrease of the Ohnishi parameter) improves the etching resistance thereof. The Ohnishi parameter for carbon-based polymers useful in the invention is typically less than 4.5, preferably less than 4, and more preferably less than 3.5. For polymers containing silicon and other etch resistant atoms, the Ohnishi parameter is incapable of predicting etch properties. For silicon-containing polymers, the etch resistance to oxygen plasma increases with increasing silicon content. Polymers high in silicon generally have high resistance to oxygen plasma reactive ion etching. Thus, silicon content is generally used as a means to predict etch properties. When high etch resistance is desired, the silicon content for silicon-containing polymers useful in the invention is typically greater than 10 wt %, preferably greater than 15 wt %, and more preferably greater than 20 wt %, greater than 25 wt % or greater than 30 wt %, based on the polymer.

Polymers useful in the shrink compositions include block and random copolymers having a plurality of distinct repeat units, for example, two, three or four distinct repeat units. Suitable copolymers useful in the shrink compositions include, for example: poly[(neopentyl methacrylate)-ran-(N,N-dimethylaminoethyl methacrylate)], poly[(neopentyl methacrylate)-ran-(2-(tert-butylamino)ethyl methacrylate)], poly[(tert-butylmethacrylate)-ran-(N,N-dimethylaminoethyl methacrylate)], poly[(tert-butylmethacrylate)-ran-(2-(tert-butylamino)ethyl methacrylate)], poly[styrene-ran-(N,N-dimethylaminoethyl methacrylate)], poly[styrene-ran-(2-vinylpyridine)], poly[(4-trimethylsilylstyrene)-ran-(2-vinylpyridine)], poly[(trimethylsilylmethyl methacrylate)-ran-(N,N-dimethylaminoethyl methacrylate)], poly[(4-trimethylsilylstyrene)-ran-(N,N-dimethylaminoethyl methacrylate)], poly[(trimethylsilylmethyl methacrylate)-ran-(2-vinylpyridine)], aminopropylmethylsiloxane-dimethylsiloxane copolymer, aminoethylaminopropylmethylsiloxane-dimethylsiloxane copolymer, aminoethylaminoisobutylmethylsiloxane-dimethylsiloxane copolymer, poly(neopentyl methacrylate)-block-(N,N-dimethylaminoethyl methacrylate), poly(neopentyl methacrylate)-block-poly(2-(tert-butylamino)ethyl methacrylate), poly(tert-butylmethacrylate)-block-poly(N,N-dimethylaminoethyl methacrylate), poly(tert-butylmethacrylate)-block-poly(2-(tert-butylamino)ethyl methacrylate), polystyrene-block-poly(N,N-dimethylaminoethyl methacrylate), polystyrene-block-poly(2-vinylpyridine), poly(4-trimethylsilylstyrene)-block-poly(2-vinylpyridine), poly(trimethylsilylmethyl methacrylate)-block-poly(N,N-dimethylaminoethyl methacrylate), poly(4-trimethylsilylstyrene)-block-poly(N,N-dimethylaminoethyl methacrylate), poly(trimethylsilylmethyl methacrylate)-block-poly(2-vinylpyridine), poly(dimethylsiloxane)-block-poly(2-vinylpyridine), and poly(dimethylsiloxane)-block-poly(N,N-dimethylaminoethyl methacrylate).

The shrink compositions typically include a single polymer, but can optionally include one or more additional polymer as described above or another polymer. Suitable polymers for use in the shrink compositions are commercially available and/or can readily be made by persons skilled in the art.

The shrink compositions further include an organic solvent or mixture of organic solvents. Suitable solvent materials to formulate and cast the shrink compositions exhibit excellent solubility characteristics with respect to the non-solvent components of the shrink compositions, but do not appreciably dissolve an underlying photoresist pattern. Suitable organic solvents for the shrink composition include, for example: alkyl esters such as n-butyl propionate, n-pentyl propionate, n-hexyl propionate and n-heptyl propionate, and alkyl butyrates such as n-butyl butyrate, isobutyl butyrate and isobutyl isobutyrate; ketones such as 2,5-dimethyl-4-hexanone and 2,6-dimethyl-4-heptanone; aliphatic hydrocarbons such as n-heptane, n-nonane, n-octane, n-decane, 2-methylheptane, 3-methylheptane, 3,3-dimethylhexane and 2,3,4-trimethylpentane, and fluorinated aliphatic hydrocarbons such as perfluoroheptane; and alcohols such as straight, branched or cyclic $C_4$-$C_9$ monohydric alcohol such as 1-butanol, 2-butanol, 3-methyl-1-butanol, isobutyl alcohol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol and 4-octanol; 2,2,3,3,4,4-hexafluoro-1-butanol, 2,2,3,3,4,4,5,5-octafluoro-1-pentanol and 2,2,3,3,4,4,5,5,6,6-decafluoro-1-hexanol, and $C_5$-$C_9$ fluorinated diols such as 2,2,3,3,4,4-hexafluoro-1,5-pentanediol, 2,2,3,3,4,4,5,5-octafluoro-1,6-hexanediol and 2,2,3,3,4,4,5,5,6,6,7,7-dodecafluoro-1,8-octanediol; and mixtures containing one or more of these solvents. Of these organic solvents, alkyl propionates, alkyl butyrates and ketones, preferably branched ketones, are preferred and, more preferably, $C_8$-$C_9$ alkyl propionates, $C_8$-$C_9$ alkyl propionates, $C_8$-$C_9$ ketones, and mixtures containing one or more of these solvents. Suitable mixed solvents include, for example, mixtures of an alkyl ketone and an alkyl propionate such as the alkyl ketones and alkyl propionates described above. The solvent component of the shrink composition is typically present in an amount of from 90 to 99 wt % based on the shrink composition.

The shrink compositions may include one or more optional additives including, for example, surfactants and antioxidants. Such optional additives if used are each typically present in the composition in minor amounts such as from 0.01 to 10 wt % based on total solids of the shrink composition.

Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly(alkylene oxide) surfactants, and fluorochemical surfactants. Suitable non-ionic surfactants include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J. Nonionic surfactants that are acetylenic diol derivatives also can be suitable. Such surfactants are commercially available from Air Products and Chemicals, Inc. of Allentown, Pa. and sold under the trade names of SURFYNOL and DYNOL. Additional suitable surfactants include other polymeric compounds such as the tri-block EO-PO-EO co-polymers PLURONIC 25R2, L121, L123, L31, L81, L101 and P123 (BASF, Inc.).

An antioxidant can be added to prevent or minimize oxidation of organic materials in the shrink composition. Suitable antioxidants include, for example, phenol-based antioxidants, antioxidants composed of an organic acid derivative, sulfur-containing antioxidants, phosphorus-based antioxidants, amine-based antioxidants, antioxidant composed of an amine-aldehyde condensate and antioxidants composed of an amine-ketone condensate. Examples of the phenol-based antioxidant include substituted phenols such as 1-oxy-3-methyl-4-isopropylbenzene, 2,6-di-tert-butylphenol, 2,6-di-tert-butyl-4-ethylphenol, 2,6-di-tert-butyl-4-methylphenol, 4-hydroxymethyl-2,6-di-tert-butylphenol, butyl•hydroxyanisole, 2-(1-methylcyclohexyl)-4,6-dimethylphenol, 2,4-dimethyl-6-tert-butylphenol, 2-methyl-4,6-dinonylphenol, 2,6-di-tert-butyl-α-dimethylamino-p-cresol, 6-(4-hydroxy-3,5-di-tert-butyl•anilino)2,4-bis•octyl-thio-1,3,5-triazine, n-octadecyl-3-(4'-hydroxy-3',5'-di-tert-butyl•phenyl)propionate, octylated phenol, aralkyl-substituted phenols, alkylated p-cresol and hindered phenol; bis-, tris- and poly-phenols such as 4,4'-dihydroxy•diphenyl, methylene•bis(dimethyl-4,6-phenol), 2,2'-methylene-bis-(4-methyl-6-tert-butylphenol), 2,2'-methylene-bis-(4-methyl-6-cyclohexyl•phenol), 2,2'-methylene-bis-(4-ethyl-6-tert-butylphenol), 4,4'-methylene-bis-(2,6-di-tert-butylphenol), 2,2'-methylene-bis-(6-α-methyl-benzyl-p-cresol), methylene-crosslinked polyvalent alkylphenol, 4,4'-butylidenebis-(3-methyl-6-tert-butylphenol), 1,1-bis-(4-hydroxyphenyl)-cyclohexane, 2,2'-dihydroxy-3,3'-di-(α-methylcyclohexyl)-5,5'-dimethyl•diphenylmethane, alkylated bisphenol, hindered bisphenol, 1,3,5-trimethyl-2,4,6-tris(3,5-di-tert-butyl-4-hydroxybenzyl)benzene, tris-(2-methyl-4-hydroxy-5-tert-butylphenyl)butane, and tetrakis-[methylene-3-(3',5'-di-tert-butyl-4'-hydroxyphenyl)propionate]methane. Suitable antioxidants are commercially available, for example, Irganox™ antioxidants (Ciba Specialty Chemicals Corp.).

The composition is free of crosslinkers such as typically used in acid diffusion resist growth processes. These processes are known to suffer from proximity and size bias, where, for example, isolated holes shrink more than dense holes due to the concentration of acid in the remaining photoresist. In addition to being free of crosslinkers, the shrink compositions are preferably free of acids and acid generator compounds, for example, thermal acid generator compounds and photoacid generator compounds, as such compounds may limit the amount of shrink achievable by the shrink composition by competing with the acid/alcohol of the resist with the sticky functionality of the shrink composition.

The shrink compositions can be prepared following known procedures. For example, the compositions can be prepared by dissolving the polymer and other optional solid components of the composition in the solvent components. The desired total solids content of the compositions will depend on factors such as the particular polymer(s) in the composition and desired final layer thickness. Preferably, the solids content of the shrink compositions is from 1 to 10 wt %, more preferably from 1 to 5 wt %, based on the total weight of the composition.

Photoresist Compositions

Photoresist compositions useful in the invention include chemically-amplified photoresist compositions comprising a matrix resin that is acid-sensitive, meaning that as part of a layer of the photoresist composition, the resin and composition layer undergo a change in solubility in an organic developer as a result of reaction with acid generated by a photoacid generator following softbake, exposure to activating radiation and post exposure bake. The change in solubility is brought about when acid-cleavable leaving groups such as photoacid-labile ester or acetal groups in the matrix polymer undergo a photoacid-promoted deprotection reaction on exposure to activating radiation and heat treatment to produce an acid or an alcohol group. Suitable photoresist compositions useful for the invention are commercially available.

For imaging at sub-200 nm wavelengths such as 193 nm, the matrix polymer is typically substantially free (e.g., less than 15 mole %) or completely free of phenyl, benzyl or other aromatic groups where such groups are highly absorbing of the radiation. Preferable acid labile groups include, for example, acetal groups or ester groups that contain a tertiary non-cyclic alkyl carbon (e.g., t-butyl) or a tertiary alicyclic carbon (e.g., methyladamantyl) covalently linked to a carboxyl oxygen of an ester of the matrix polymer.

Suitable matrix polymers further include polymers that contain (alkyl)acrylate units, preferably including acid-labile (alkyl)acrylate units, such as t-butyl acrylate, t-butyl methacrylate, methyladamantyl acrylate, methyl adamantyl methacrylate, ethylfenchyl acrylate, ethylfenchyl methacrylate, and the like, and other non-cyclic alkyl and alicyclic (alkyl)acrylates. Other suitable matrix polymers include, for example, those which contain polymerized units of a non-aromatic cyclic olefin (endocyclic double bond) such as an optionally substituted norbornene.

Still other suitable matrix polymers include polymers that contain polymerized anhydride units, particularly polymerized maleic anhydride and/or itaconic anhydride units, such as disclosed in European Published Application EP01008913A1 and U.S. Pat. No. 6,048,662.

Also suitable as the matrix polymer is a resin that contains repeat units that contain a hetero atom, particularly oxygen and/or sulfur (but other than an anhydride, i.e., the unit does not contain a keto ring atom). The heteroalicyclic unit can be fused to the polymer backbone, and can comprise a fused carbon alicyclic unit such as provided by polymerization of a norbornene group and/or an anhydride unit such as provided by polymerization of a maleic anhydride or itaconic anhydride. Such polymers are disclosed in PCT/US01/14914 and U.S. Pat. No. 6,306,554. Other suitable heteroatom group containing matrix polymers include polymers that contain polymerized carbocyclic aryl units substituted with one or more hetero-atom (e.g., oxygen or sulfur) containing groups, for example, hydroxy naphthyl groups, such as disclosed in U.S. Pat. No. 7,244,542.

Blends of two or more of the above-described matrix polymers can suitably be used in the photoresist compositions.

Suitable matrix polymers for use in the photoresist compositions are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000.

The photoresist composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the PAG will be suitable for chemically amplified resists as compared with non-chemically amplified materials.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable solvents for the photoresist compositions include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as acetone, methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

The photoresist compositions can also include other optional materials. For example, the compositions can include one or more of actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition.

A preferred optional additive of the resist compositions is an added base. Suitable bases include, for example: linear and cyclic amides and derivatives thereof such as N,N-bis(2-hydroxyethyl)pivalamide, N,N-Diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl)amine, 2,2',2",2"'-(ethane-1,2-diylbis(azanetriyl))tetraethanol, and 2-(dibutylamino)ethanol, 2,2',2"-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl) morpholine. The added base is typically used in relatively small amounts, for example, from 0.01 to 5 wt %, preferably from 0.1 to 2 wt %, based on total solids of the photoresist composition.

The photoresists can be prepared following known procedures. For example, the resists can be prepared as coating compositions by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

Suitable NTD photoresists are known in the art and include, for example, those described in US Patent Publications US20130115559A1, US20110294069A1, US20120064456A1, US20120288794A1, US20120171617A1, US20120219902A1 and U.S. Pat. No. 7,998,655B2.

Shrink Methods

Processes in accordance with the invention will now be described with reference to FIG. 1A-F, which illustrates an exemplary process flow for forming a photolithographic pattern by negative tone development.

FIG. 1A depicts in cross-section a substrate 100 which can include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer and/or a bottom antireflective coating (BARC) over which a photoresist layer 104 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™40A and AR™124 antireflectant materials.

A photoresist layer 104 formed from a composition such as described herein is disposed on the substrate over the antireflective layer (if present). The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning. A typical thickness for the photoresist layer 104 is from about 500 to 3000 Å.

The photoresist layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The photoresist layer 104 is next exposed to activating radiation 106 through a patterned photomask 108 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions corresponding to regions of the resist layer to remain and be removed, respectively, in a subsequent development step. The exposure wavelength is typically sub-400 nm, sub-300 nm or sub-200 nm, with 248 nm, 193 nm and EUV wavelengths (e.g., 13.5 nm) being typical. The methods find use in immersion or dry (non-immersion) lithography techniques. The exposure energy is typically from about 10 to 80 mJ/cm$^2$, dependent upon the exposure tool and the components of the photoresist composition.

Following exposure of the photoresist layer 104, a post-exposure bake (PEB) is performed. Acid generated by the acid generator causes cleavage of the acid cleavable leaving groups to form acid groups, typically carboxylic acid groups, and/or alcohol groups. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds.

Figure 1B:
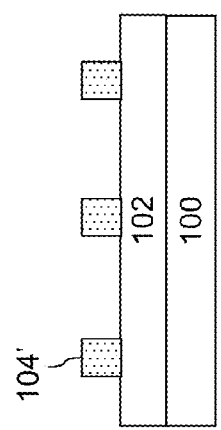

The exposed photoresist layer is next developed to remove unexposed regions, leaving exposed regions forming a negative resist pattern 104' as shown in FIG. 1B. Resist pattern 104' includes the carboxylic acid group and/or the alcohol group. The negative tone developer is an organic solvent developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Other suitable solvents include those used in the photoresist composition. The developer is preferably 2-heptanone or a butyl acetate such as n-butyl acetate.

The organic solvent(s) are typically present in the developer in a combined amount of from 90 wt % to 100 wt %, more typically greater than 95 wt %, greater than 98 wt %, greater than 99 wt % or 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove the unexposed regions of the photoresist, with a time of from 5 to 30 seconds being typical. Development is typically conducted at room temperature.

Following development, the resist pattern 104' can optionally be heat treated in a hardbake process to further remove solvent from the resist pattern. The optional hardbake is typically conducted with a hot plate or oven, and is typically conducted at a temperature of about 90° C. or higher, for example, from about 100 to 150° C., and a time of from about 30 to 120 seconds.

Figure 1C:
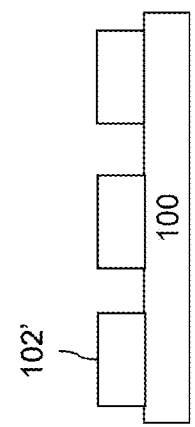

With reference to FIG. 1C, a shrink composition as described herein is coated over the resist pattern 104' to form a shrink composition layer 112. Depending on the particular process, the shrink composition can be applied so as to cover the resist pattern entirely or to a height less than or equal to the thickness of the resist pattern so as not to cover the resist pattern top surface, depending on the particular application.

The shrink composition layer 112 is typically next soft-baked to remove solvent from the composition and to cause the shrink polymer to self-assemble and induce bonding between the sticky portion of the polymer and the deprotected acid and/or alcohol group of the photoresist pattern. A typical softbake for the shrink composition is conducted at a temperature of from about 90 to 150° C., and a time of from about 30 to 120 seconds.

Figure 1D:
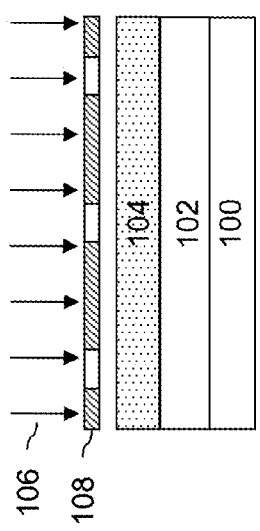

Residual shrink composition including polymer that is not bonded to the resist pattern is next removed from the substrate by rinsing, leaving behind a layer 112' of the polymer bound to the resist pattern as shown in FIG. 1D. With removal of the residual shrink composition the effective thickness of the resist pattern sidewalls is increased, thereby reducing the spacing between adjacent lines or within a trench or hole pattern. Suitable rinsing solutions include organic solvent developers in which the polymer is soluble. Suitable materials include, for example, those developers described herein with respect to the NTD developers. Of these, n-butyl acetate and 2-heptanone are typical. The resulting image typically has an improved (i.e., reduced) surface roughness as compared with that of the resist pattern following development of the photoresist layer.

Optionally, a post-rinse bake can be conducted at a temperature above the $T_g$ of the shrink polymer but below the $T_g$ of the resist pattern. This bake can provide beneficial results, for example, in the form of improved pattern roughness or circularity due to the thermodynamic drive of the shrink polymer to minimize its interfacial area with air.

Figure 1E:
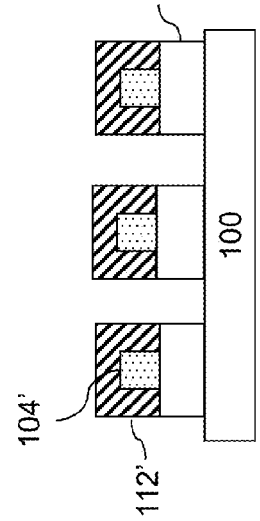
Figure 1F:
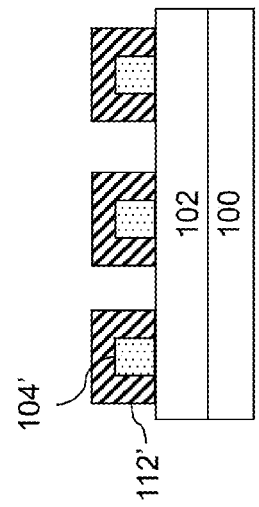

The one or more underlying layers 102 can next be selectively etched using the resist pattern 104' with bonded shrink material 112' as an etch mask to form etched pattern 102', thereby exposing the underlying substrate 100 as shown in FIG. 1E. Suitable etching techniques and chemistries for etching layers 102 are known in the art, with dry-etching processes such as reactive ion etching being typical. The resist pattern 104' and shrink material 112' are next removed from the substrate using known techniques, for example, oxygen plasma ashing.

The following non-limiting examples are illustrative of the invention.

EXAMPLES

Number and weight-average molecular weights, Mn and Mw, and polydispersity values, Mw/Mn or PDI, were measured by gel permeation chromatography (GPC) on an Agilent 1100 series LC system equipped with an Agilent 1100 series refractive index and MiniDAWN light scattering detector (Wyatt Technology Co.). Samples were dissolved in HPCL grade THF at a concentration of approximately 1 mg/mL and filtered through at 0.20 μm syringe filter before injection through the two PLGel 300×7.5 mm Mixed C columns (5 mm, Polymer Laboratories, Inc.). A flow rate of 1 mL/min and temperature of 35° C. were maintained. The columns were calibrated with narrow molecular weight PS standards (EasiCal PS-2, Polymer Laboratories, Inc.).

Proton NMR spectroscopy was done on a Varian INOVA 400 MHz NMR spectrometer. Deuterated tetrahydrofuran was used for all NMR spectra. A delay time of 10 seconds was used to ensure complete relaxation of protons for quantitative integrations. Chemical shifts were reported relative to tetramethylsilane (TMS).

Top-down scanning electron micrographs were acquired using a Hitachi 59380 scanning electron microscope (SEM) at 250K magnification. Cross-section SEM images were acquired after sectioning the wafer using an Amray 1910 scanning electron microscope. Critical dimension (CD) and pitch were determined based on the SEM images using Igor Pro software.

Photoresist Composition 1 Preparation 282.003 g of Matrix Polymer A was dissolved in a solvent including 4049.298 g of PGMEA, 3239.438 g of methyl-2-hydroxyisobutyrate and 809.860 g of Gamma-butyrolactone. To this mixture was added 13.903 g of PAG A, 5.003 g of PAG B, 6.468 g of Polymer Additive A, 2.781 g of Dodecyl diethylamine and 13.247 g of PAG C. The resulting mixture was rolled on a roller for 24 hours and then filtered through a 0.05 μm Teflon/0.02 μm Nylon/0.005 μm Polyethylene filter scheme 5 times.

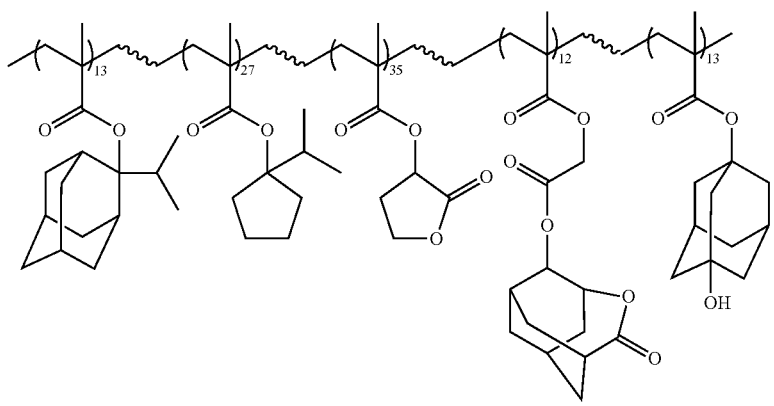

Matrix Polymer A

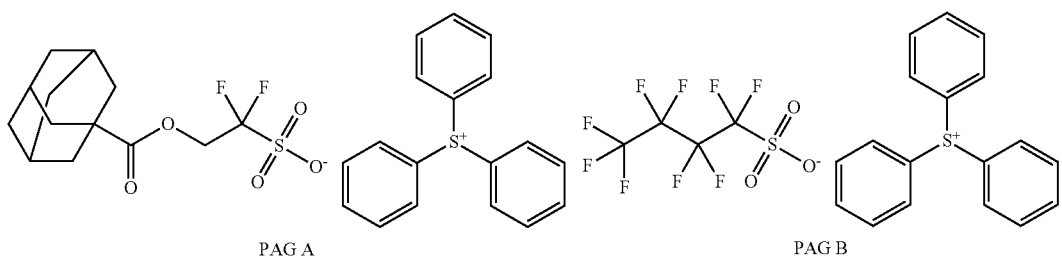

PAG A  PAG B

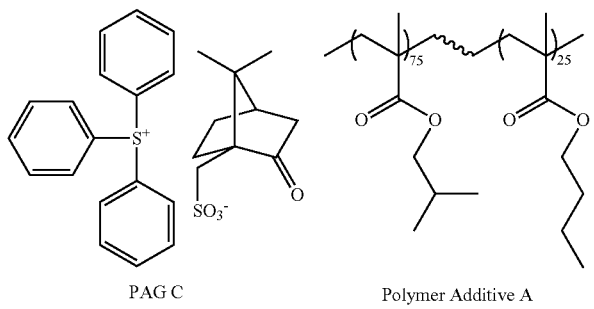

PAG C  Polymer Additive A

Photoresist Composition 2 Preparation 1.663 g of Matrix Polymer B was dissolved in 29.023 g of PGMEA, 20.316 g of methyl-2-hydroxyisobutyrate and 8.707 g of 2-heptanone. To this mixture was added 0.136 g of PAG D, 0.094 g of PAG E, 0.019 g of tert-butyl (1,3-dihydroxy-2-(hydroxymethyl)propan-2-yl)carbamate quencher and 0.039 g of Polymer Additive A. The resulting mixture was rolled on a roller for six hours and then filtered through a Teflon filter having a 0.2 micron pore size.

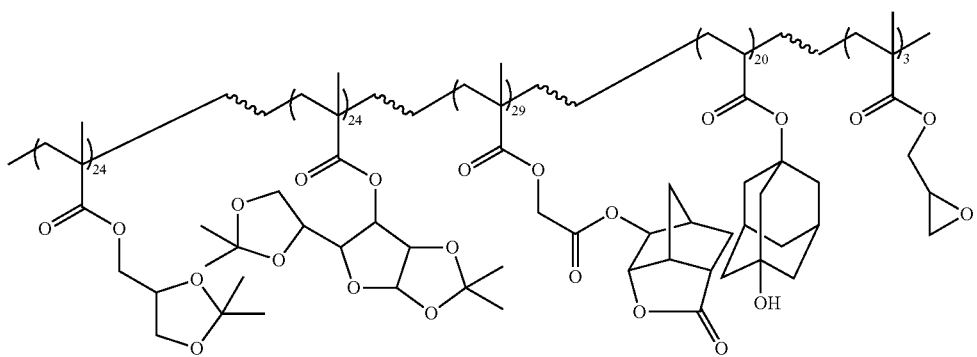

Matrix Polymer B

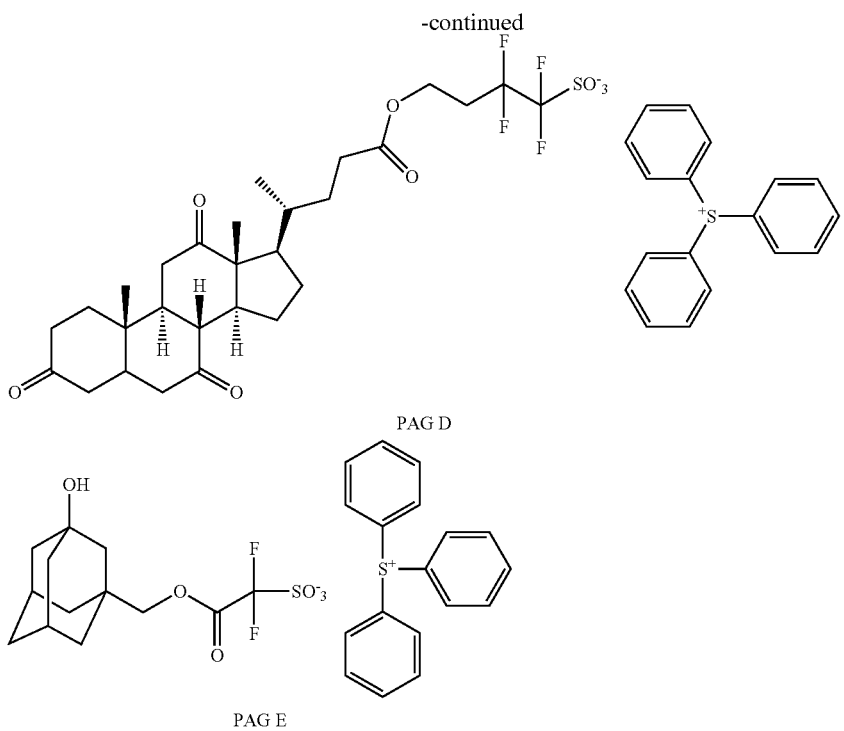

PAG D

PAG E

Example 1

Synthesis of P(NPMA-ran-DMAEMA)

28.491 g of neopentyl methacrylate (NPMA) and 1.509 g of 2-(dimethylamino)ethyl methacrylate (DMAEMA) monomers were dissolved in 45 g of PGMEA. The monomer solution was degassed by bubbling with nitrogen for 20 min. PGMEA (21.063 g) was charged into a 500 mL three-neck flask equipped with a condenser and a mechanical stirrer and was degassed by bubbling with nitrogen for 20 min. Subsequently, the solvent in the reaction flask was brought to a temperature of 80° C. Dimethyl 2,2'-azobis(2-methylpropionate) initiator (V601, 0.890 g) was dissolved in 6 g of PGMEA and the initiator solution was degassed by bubbling with nitrogen for 20 min. The initiator solution was added into the reaction flask and then monomer solution was fed into the reactor dropwise over a 3 hour period under rigorous stirring and nitrogen environment. After monomer feeding was complete, the polymerization mixture was left standing for an additional one hour at 80° C. After a total of 4 hours of polymerization time (3 hours of feeding and 1 hour of post-feeding stirring), the polymerization mixture was allowed to cool down to room temperature. Precipitation was carried out in methanol/water (8/2) mixture (1235 g). Precipitated polymer was collected by filtration, air-dried overnight, re-dissolved in 90 g of THF, and re-precipitated into methanol/water (8/2) mixture (1235 g). The final polymer was filtered, air-dried overnight and further dried under vacuum at 25° C. for 48 hours to give 22.8 g of P(NPMA-ran-DMAEMA) copolymer with Mw=6,650 g/mol, Mw/Mn=1.09. The polymer structure is shown below with the composition based on molar feed ratio in the polymerization. The polymer has an estimated Ohnishi parameter of 3.9.

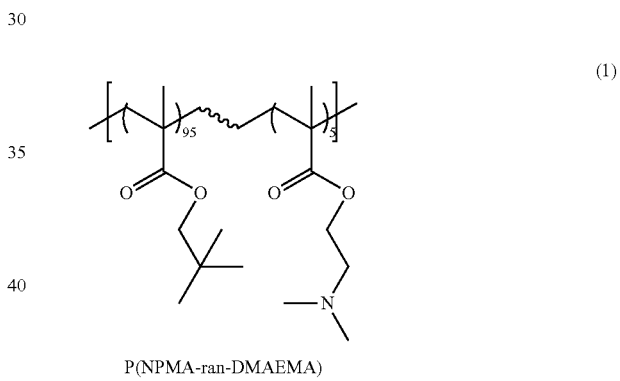

P(NPMA-ran-DMAEMA)

(1)

Example 2

Synthesis of P(NPMA-ran-TBAEMA)

26.507 g of neopentyl methacrylate (NPMA) and 3.493 g of 2-(tert-butylamino)ethyl methacrylate (TBAEMA) monomers were dissolved in 45 g of PGMEA. The monomer solution was degassed by bubbling with nitrogen for 20 min. PGMEA (21.026 g) was charged into a 500 mL three-neck flask equipped with a condenser and a mechanical stirrer and was degassed by bubbling with nitrogen for 20 min. Subsequently, the solvent in the reaction flask was brought to a temperature of 80° C. Dimethyl 2,2'-azobis(2-methylpropionate) initiator (V601, 0.868 g) was dissolved in 6 g of PGMEA and the initiator solution was degassed by bubbling with nitrogen for 20 min. The initiator solution was added into the reaction flask and the monomer solution was then fed into the reactor dropwise over a 3 hour period under rigorous stirring and nitrogen environment. After monomer feeding was complete, the polymerization mixture was left standing for an additional one hour at 80° C. After a total of 4 hours of polymerization time (3 hours of feeding and 1 hour of post-feeding stirring), the polymerization mixture was allowed to cool down to room temperature. Precipitation was carried out in methanol/water (8/2) mixture (1235 g). The precipitated polymer was collected by filtration, air-dried overnight, re-dissolved in 90 g of THF, and re-precipitated into methanol/water (8/2) mixture (1235 g). The final polymer was filtered, air-dried overnight and further dried under vacuum at 25° C. for 48 hours to give 22.5 g of P(NPMA-ran-TBAEMA) with Mw=15,139 g/mol, Mw/Mn=1.91. The polymer structure is shown below with the composition based on molar feed ratio in the polymerization. The polymer has an estimated Ohnishi parameter of 3.9.

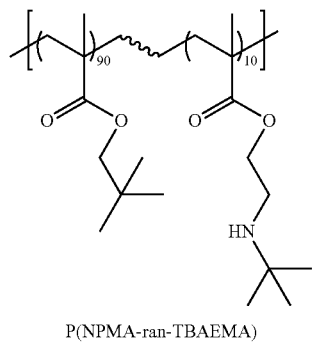

P(NPMA-ran-TBAEMA)

Example 3

Synthesis of PtBMA-b-PDMAEMA (1)

Dimethyl 2,2'-azobis(2-methylpropionate) (0.101 g), tert-butylmethacrylate (20.000 g), 2-cyanopropan-2-yl benzodithioate (CPBD, 0.389 g), ethyl acetate (20 mL) and a magnetic stir bar were loaded into a 250 mL glass bottle. The mixture was deoxygenated by nitrogen gas for 1 hour and then the flask was placed in a heat block at 70° C. for 24 hours. After the reaction, the flask was cooled, ethyl acetate was evaporated by keeping the bottle open for 2 hours and bubbling $N_2$. The reaction mixture was then dissolved in 60 mL THF and precipitated into 1 L methanol/water mixture (9:1). The precipitate was collected and re-precipitated. The polymer (PtBMA) was collected and dried in a vacuum oven at room temperature overnight. Using PtBMA as a macro-initiator, 2-(dimethylamino)ethyl methacrylate (DMAEMA) monomers were polymerized using a similar procedure set forth above. 4.000 g of PtBMA, 2.210 g of DMAEMA, 0.087 g of dimethyl 2,2'-azobis(2-methylpropionate) and a magnetic stir bar were loaded into a 50 mL reactor. Ethyl acetate (6 mL) was deoxygenated and added to the reactor in a glove box. The reactor was then sealed with a septum and placed in a heat block at 70° C. for 24 hrs. After the reaction, the flask was cooled, ethyl acetate was evaporated by keeping the bottle open for 2 hours and bubbling $N_2$. The reaction mixture was then dissolved in 60 mL of THF and precipitated into 1 L methanol/water mixture (9:1). The precipitate was collected and re-precipitated. The polymer was collected and dried in a vacuum oven at room temperature overnight. The resulting PtBMA-b-PDMAEMA (1) had a Mn of 17.2 kg/mol, a PDI of 1.27, and 37 mole % PDMAEMA by 1H NMR. The polymer has an estimated Ohnishi parameter of 4.1.

(1)

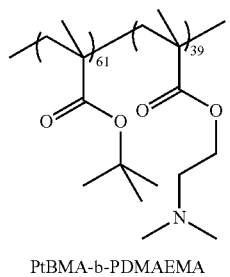

PtBMA-b-PDMAEMA

Example 4

Synthesis of PtBMA-b-PDMAEMA (2)

Dimethyl 2,2'-azobis(2-methylpropionate) (0.101 g), tert-butylmethacrylate (20.000 g), 2-cyanopropan-2-yl benzodithioate (CPBD, 0.389 g), ethyl acetate (20 mL) and a magnetic stir bar were loaded into a 250 mL glass bottle. The mixture was deoxygenated by nitrogen gas for 1 hour and then the flask was placed in a heat block at 70° C. for 24 hours. After the reaction, the flask was cooled, ethyl acetate was evaporated by keeping the bottle open for 2 hours and bubbling $N_2$. The reaction mixture was then dissolved in 60 mL THF and precipitated into 1 L methanol/water mixture (9:1). The precipitate was collected and re-precipitated. The polymer (PtBMA) was collected and dried in a vacuum oven at room temperature overnight. Using PtBMA as a macro-initiator, 2-(dimethylamino)ethyl methacrylate (DMAEMA) monomers were polymerized using a similar procedure set forth above. 3.000 g of PtBMA, 3.315 g of DMAEMA, 0.065 g of dimethyl 2,2'-azobis(2-methylpropionate) and a magnetic stir bar were loaded into a 50 mL reactor. Ethyl acetate (6 mL) was deoxygenated and added to the reactor in a glove box. The reactor was then sealed with a septum and placed in a heat block at 70° C. for 24 hrs. After the reaction, the flask was cooled, ethyl acetate was evaporated by keeping the bottle open for 2 hours and bubbling $N_2$. The reaction mixture was then dissolved in 60 mL of THF and precipitated into 1 L methanol/water mixture (9:1). The precipitate was collected and re-precipitated. The polymer was collected and dried in a vacuum oven at room temperature overnight. The resulting PtBMA-b-PDMAEMA had Mn of 24.2 kg/mol, PDI of 1.29, and 54 mole % PDMAEMA by 1H NMR. The polymer has an estimated Ohnishi parameter of 4.2.

(2)

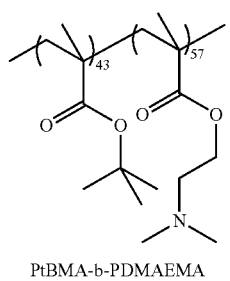

PtBMA-b-PDMAEMA

PS-b-PDMAEMA Polymers

Polystyrene-block-poly(N,N-dimethylaminoethylmethacrylate) (PS-b-PDMAEMA) polymers as described in Table 1 (from Polymer Source Inc., Dorval, Canada) were used in forming shrink compositions as described below.

TABLE 1

| Material ID | Mn of PS block (kg/mol) | Mn of PDMAEMA block (kg/mol) | Mw/Mn | Ohnishi parameter |
|---|---|---|---|---|
| PS-b-PDMAEMA (1) | 6.7 | 9.2 | 1.06 | 3.4 |
| PS-b-PDMAEMA (2) | 14 | 8.3 | 1.11 | 2.9 |
| PS-b-PDMAEMA (3) | 14.5 | 3.6 | 1.27 | 2.5 |
| PS-b-PDMAEMA (4) | 30 | 2.5 | 1.15 | 2.2 |

Siloxane Polymers

The following random copolymers (from Gelest, Inc., Morrisville, Pa.) were used in forming shrink compositions as described below, wherein the compositions as shown are in mole %:

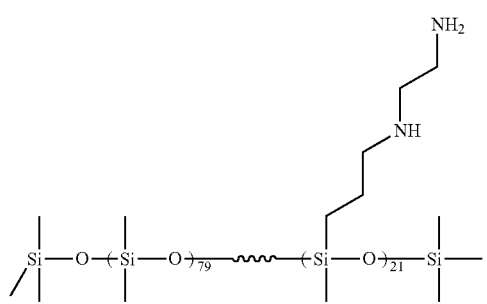

AMS-2202

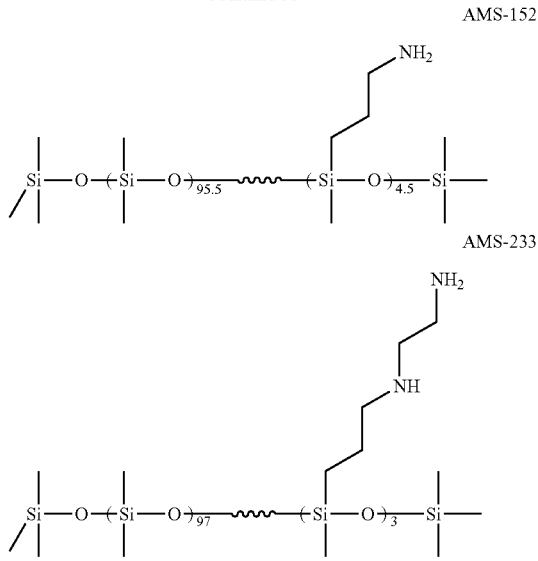

AMS-152

AMS-233

AMS-2202=Aminoethylaminopropylmethylsiloxane-dimethylsiloxane copolymer; AMS-152=Aminopropylmethylsiloxane-dimethylsiloxane copolymer; and AMS-233=Aminoethylaminopropylmethylsiloxane-dimethylsiloxane copolymer. These polymers are calculated as having total silicon content of 32 wt % Si for AMS-2202, 37 wt % Si for AMS-152, and 37 wt % Si for AMS-233.

Shrink Composition Formulation

Shrink compositions were prepared by dissolving polymers in organic solvents using the components and amounts set forth in Table 2, and filtering the composition: with a 0.2 micron ultra-high molecular weight polyethylene (UPE) filter (Examples 5-7); with a 0.02 micron UPE filter (Examples 8-13); or with a 0.2 micron Teflon filter (Examples 14-16).

TABLE 2

| Example | Shrink Comp. | Polymer | Solvent | Polymer Content |
|---|---|---|---|---|
| Ex. 5 | SC-1 | P(NPMA-ran-DMAEMA) (0.4 g) | 4-methyl-2-pentanol (19.6 g) | 2 wt % |
| Ex. 6 | SC-2 | P(NPM-ran-TBAEMA) (0.4 g) | 4-methyl-2-pentanol (19.6 g) | 2 wt % |
| Ex. 7 | SC-3 | PtBMA-b-PDMAEMA (1) (0.4 g) | 4-methyl-2-pentanol (19.6 g) | 2 wt % |
| Ex. 8 | SC-4 | PtBMA-b-PDMAEMA (1) (0.450 g) | PGMEA (14.550 g) | 3 wt % |
| Ex. 9 | SC-5 | PtBMA-b-PDMAEMA (2) (0.621 g) | PGMEA (20.079 g) | 3 wt % |
| Ex. 10 | SC-6 | PS-b-PDMAEMA (1) (0.204 g) | PGMEA (50 vol. %)/methyl-2-hydroxyisobutyrate (50 vol. %) (6.596 g) | 3 wt % |
| Ex. 11 | SC-7 | PS-b-PDMAEMA (2) (0.198 g) | PGMEA (50 vol. %)/methyl-2-hydroxyisobutyrate (50 vol. %) (6.402 g) | 3 wt % |
| Ex. 12 | SC-8 | PS-b-PDMAEMA (3) (0.210 g) | PGMEA (50 vol. %)/methyl-2-hydroxyisobutyrate (50 vol. %) (6.790 g) | 3 wt % |
| Ex. 13 | SC-9 | PS-b-PDMAEMA (4) (0.210 g) | PGMEA (50 vol. %)/methyl-2-hydroxyisobutyrate (50 vol. %) (6.790 g) | 3 wt % |
| Ex. 14 | SC-10 | AMS-2202 (0.400 g) | Amyl Acetate (19.600 g) | 2 wt % |
| Ex. 15 | SC-11 | AMS-152 (0.375 g) | Heptane (14.625 g) | 2.5 wt % |
| Ex. 16 | SC-12 | AMS-233 (0.375 g) | Heptane (14.625 g) | 2.5 wt % |

Example 17

NTD Shrink of Line/Space Patterns

Two negative tone development (NTD) resist-patterned wafers with a pitch of 150 nm and various critical dimensions (CDs) were prepared using the same lithography process, one as a control and another to undergo an NTD shrink process. The wafers included a 220 Å organosilicon antireflectant layer coated over a 1350 Å organic underlayer. Photoresist Composition 1 was then spin-coated to a thickness of 1000 Å followed by a soft bake at 90° C. for 60 s. The resist was then exposed using an ASML 1100 scanner with a numerical aperture (NA) of 0.75 and Dipole-35Y illumination through a line/space reticle with pitch of 150 nm at varying dose across the wafer to form series of a line/space patterns with varying CD. After exposure, a post-exposure bake was performed at 90° C. for 60 s, and the pattern was then developed using n-butyl acetate (nBA).

Figure 2:
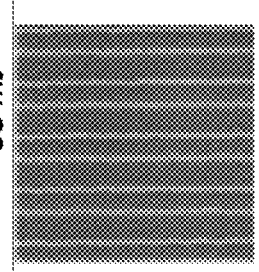
FIG. 2 illustrates line/space patterns at different exposure doses before and after a shrink method in accordance with the invention.
Figure 3:
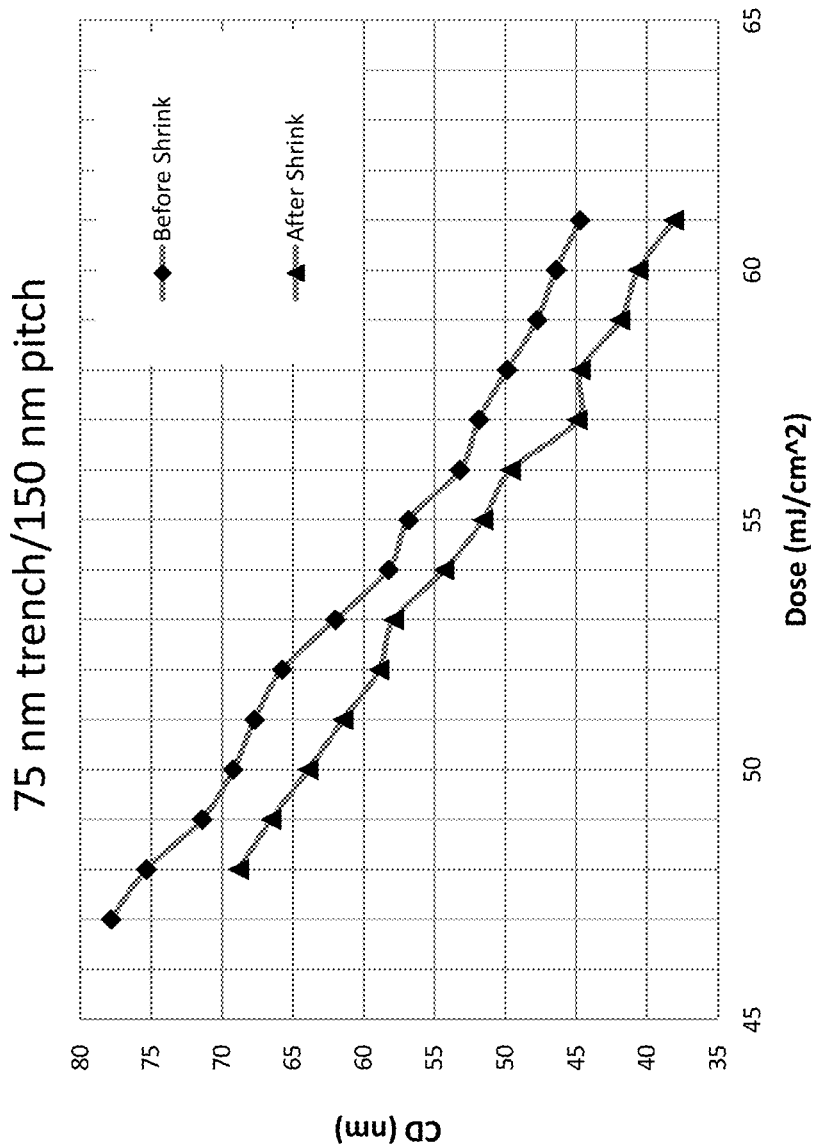
FIG. 3 is a plot of CD as a function of dose for trench patterns before and after a shrink method in accordance with the invention.

One wafer was next observed by SEM as a control without undergoing a shrink process. Pre-NTD shrink data presented in this and other examples is based on the control samples. The second wafer was overcoated with shrink composition SC-4. The solution gave a film thickness of 825 Å on a blank wafer when coated at 1500 rpm. After overcoating the NTD resist pattern at 1500 rpm, the wafer was soft baked at 150° C. for 60 s. An n-butylacetate rinse was then performed, and the patterns were observed using SEM. FIG. 2 shows representative top-down SEM images of line/space patterns before and after shrink for various exposure doses, and FIG. 3 is a plot of CD as a function of dose, before and after the NTD shrink process. The NTD shrink process resulted in an average CD shrink of about 4-5 nm independent of the starting CD.

Example 18

NTD Shrink of Line/Space Patterns

Two negative tone development (NTD) resist-patterned wafers with a pitch of 150 nm and various CDs were prepared using the same lithography process, one as a control and another to undergo an NTD shrink process. The wafers included a 220 Å organosilicon antireflectant layer coated over a 1350 Å organic underlayer. Photoresist Composition 1 was spin-coated to a thickness of 1000 Å followed by a soft bake at 90° C. for 60 s. The resist was then exposed using an ASML 1100 scanner with a numerical aperture (NA) of 0.75 and Dipole-35Y illumination through a line/space reticle with pitch of 150 nm at varying dose across the wafer to form series of a line/space patterns with varying CD. After exposure, a post-exposure bake was performed at 90° C. for 60 s, and the pattern was developed using n-butyl acetate.

Figure 4:
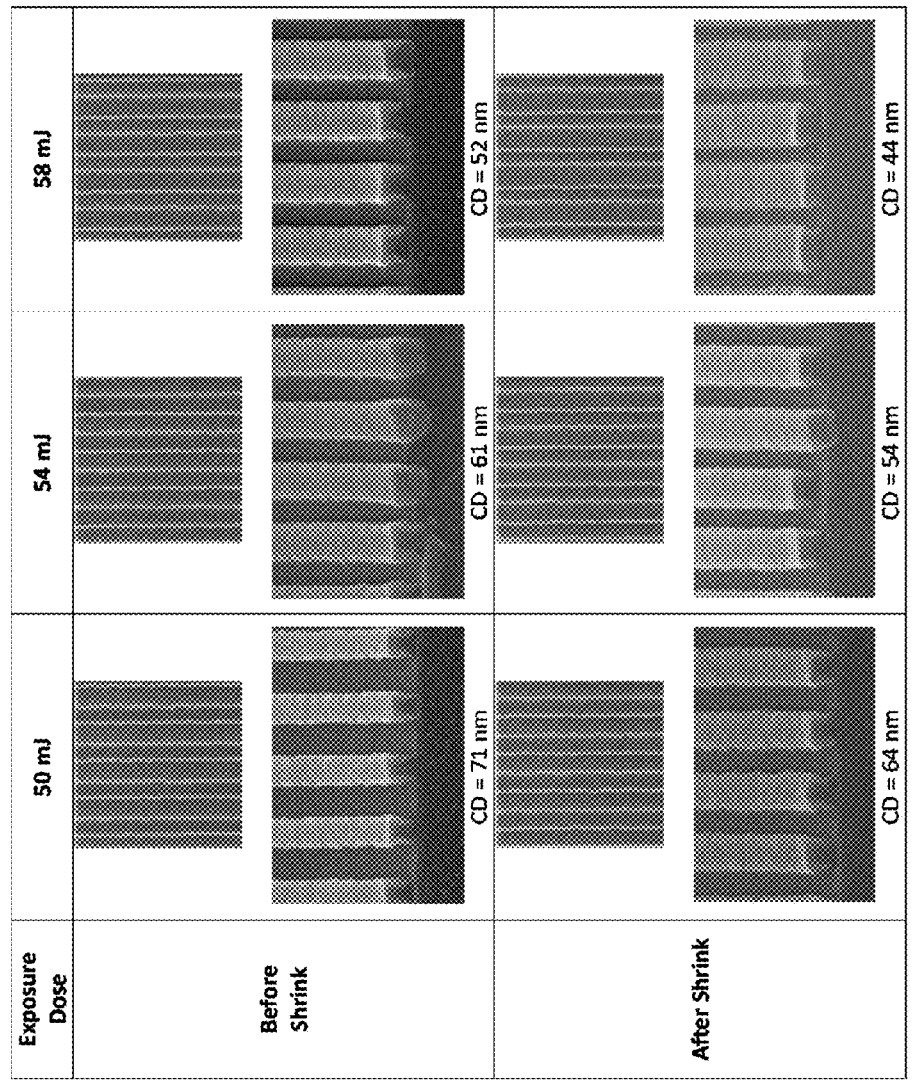
FIG. 4 shows SEM images of line/space patterns at various exposure doses before and after a shrink method in accordance with the invention.
Figure 5:
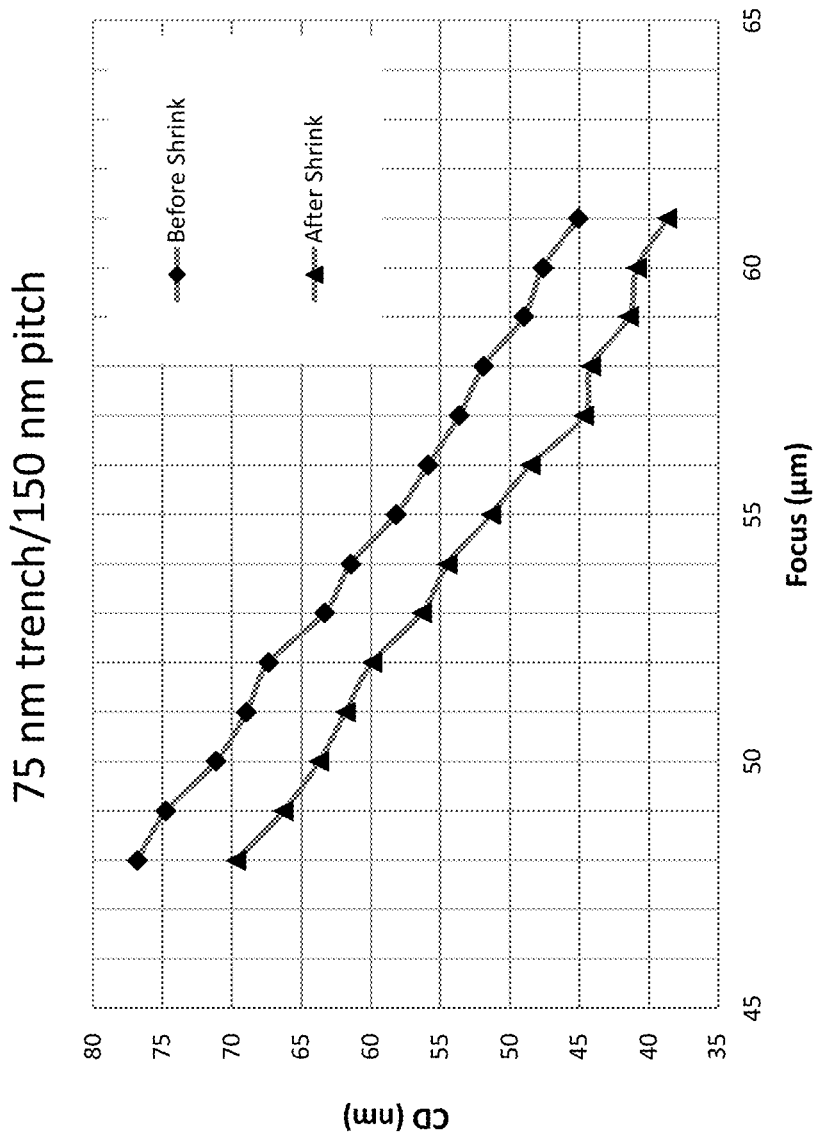
FIG. 5 is a plot of CD as a function of focus for trench patterns before and after a shrink method in accordance with the invention.
Figure 6A:
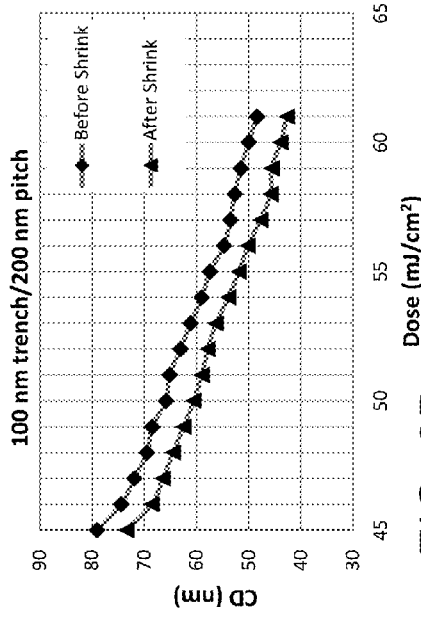
FIG. 6A-D shows plots of CD as a function of dose for line/space and trench patterns before and after a shrink method in accordance with the invention.
Figure 6B:
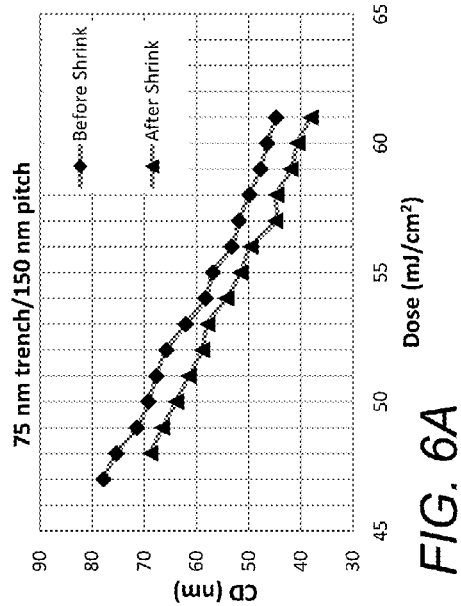
Figure 6C:
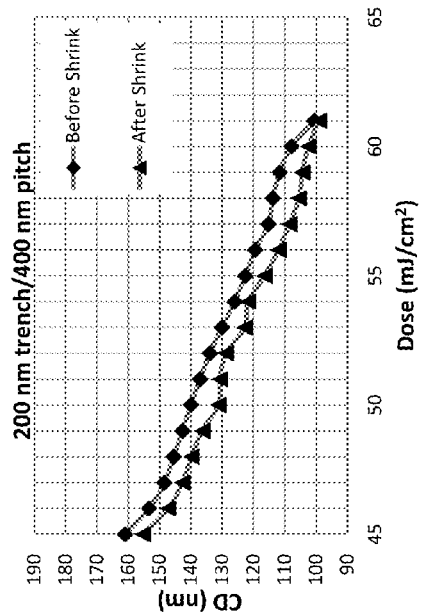
Figure 6D:
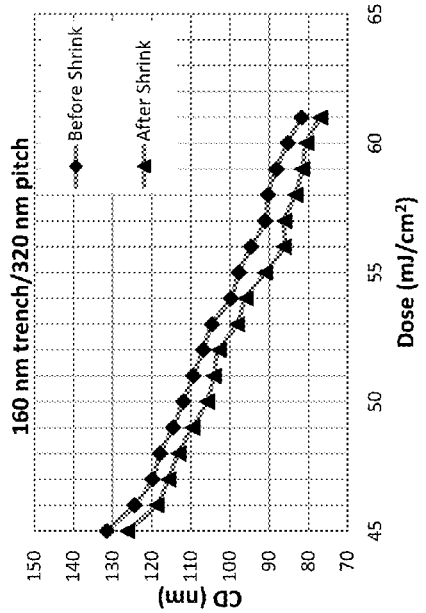

One wafer was observed by SEM as a control. The second wafer was overcoated with shrink composition SC-5. The solution gave a film thickness of 825 Å on a blank wafer when coated at 1500 rpm. After overcoating the NTD lines at 1500 rpm, the wafer was soft baked at 150° C. for 60 s. An n-butylacetate rinse was performed, and the patterns were observed using SEM. FIG. 4 shows representative cross-sectional and top-down SEM images of line/space patterns, and FIG. 5 is a plot of CD as a function of focus, before and after the NTD shrink process. The NTD shrink process resulted in an average CD shrink of about 8 nm independent of the starting CD. The cross-sectional images in FIG. 4 show clean profiles with no scumming at the bottom of the trench. FIG. 5 shows that a substantially constant shrink amount resulted across the focus range.

Example 19

NTD Shrink of Line/Space Patterns

A series of negative tone development (NTD) wafers with various pitches including 150, 200, 300, and 400 nm, and various CDs were prepared using the same lithography process and different reticles to produce the different pitches. Two wafers were made for each pitch, one as a control and another to undergo an NTD shrink process. The wafers included a 220 Å organosilicon antireflectant layer coated over a 1350 Å organic underlayer. Photoresist Composition 1 was spin-coated to a thickness of 1000 Å followed by a soft bake at 90° C. for 60 s. The resist was then exposed using an ASML 1100 scanner with a numerical aperture (NA) of 0.75 and Dipole-35Y illumination through a line/space reticle with the desired pitch at varying dose across the wafer to form series of a line/space patterns with varying CD. After exposure, a post-exposure bake was performed at 90° C. for 60 s, and the pattern was developed using n-butyl acetate.

For each pitch, one wafer was observed by SEM as a control. The second wafer was overcoated with shrink composition SC-5. The solution gave a film thickness of 825 Å on a blank wafer when coated at 1500 rpm. After overcoating the NTD lines at 1500 rpm, the wafer was soft baked at 150° C. for 60 s. An n-butyl acetate rinse was then performed, and the patterns were observed using SEM. FIG. 6A-D show plots of CD as a function of dose for line/space patterns of various pitches before and after the NTD shrink process. The NTD shrink process resulted in an average CD shrink of 5.4-6.1 nm independent of the starting CD and pitch.

Example 20

NTD Shrink of Line/Space Patterns

Five negative tone development (NTD) wafers with a pitch of 150 nm and various CDs were prepared using the same lithography process, one as a control and others to undergo NTD shrink processes with various PS-b-PD-MAEMA-containing shrink compositions. The wafers included a 220 Å organosilicon antireflectant layer coated over a 1350 Å organic underlayer. Photoresist Composition 1 was spin-coated to a thickness of 1000 Å followed by a soft bake at 90° C. for 60 s. The resist was exposed using an ASML 1100 scanner with a numerical aperture (NA) of 0.75 and Dipole-35Y illumination through a line/space reticle with pitch of 150 nm at varying dose across the wafer to form series of a line/space patterns with varying CD. After exposure, a post-exposure bake was performed at 90° C. for 60 s, and the pattern was developed using n-butylacetate.

Figure 7:
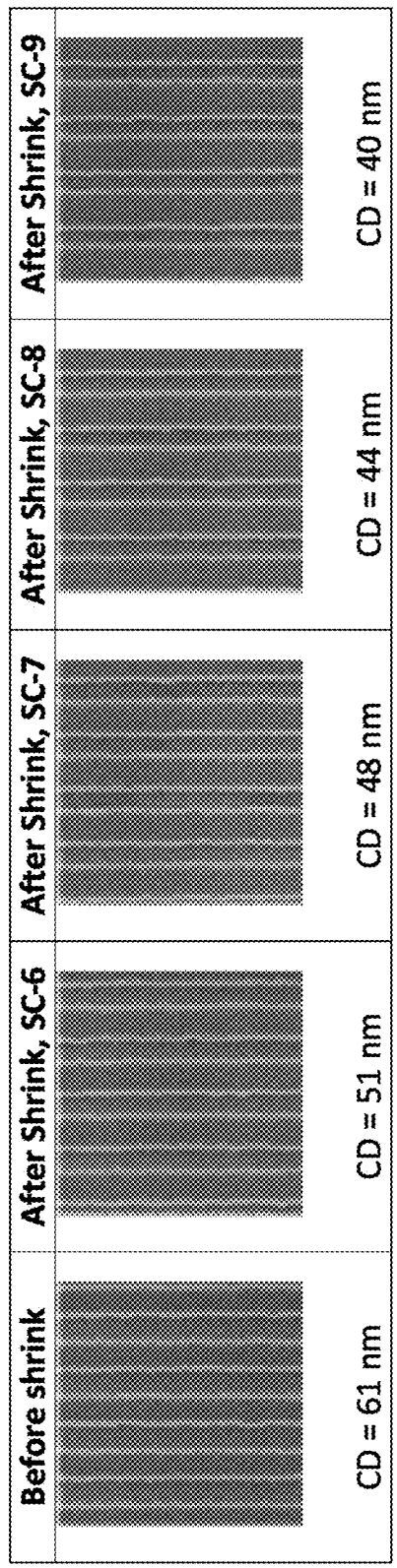
FIG. 7 shows top-down SEM images of line/space patterns before and after a shrink method in accordance with the invention.
Figure 8:
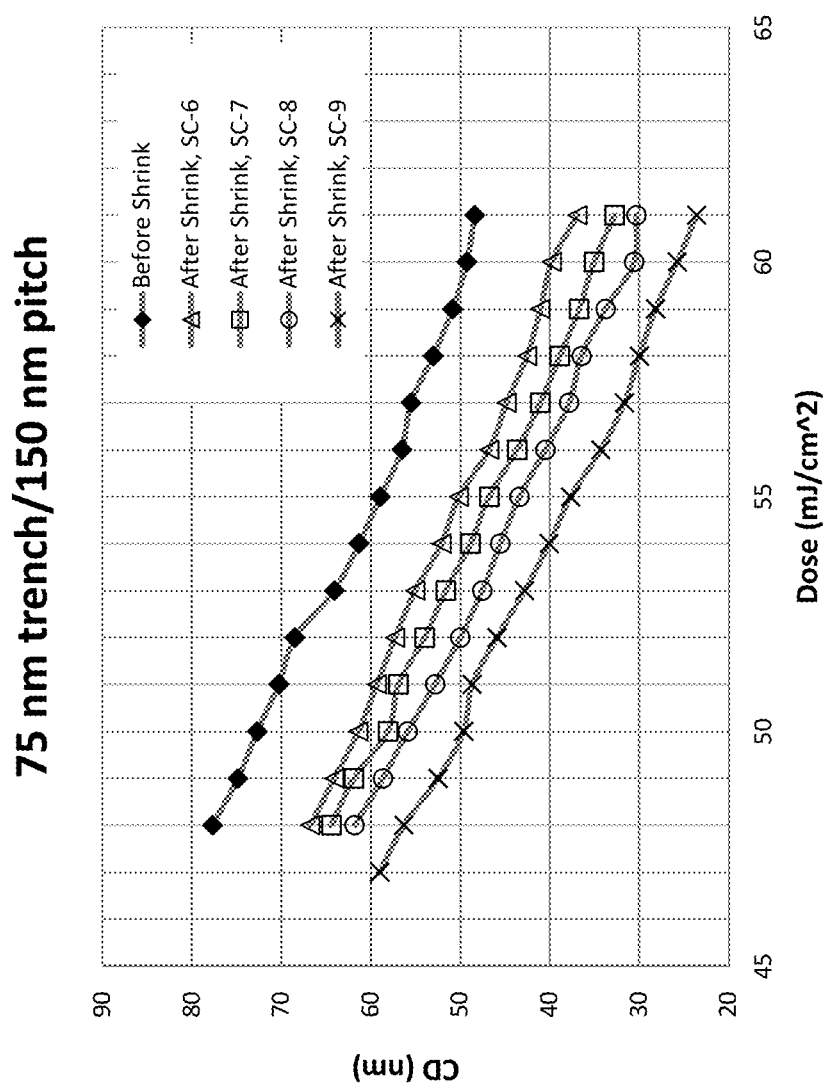
FIG. 8 is a plot of CD as a function of dose for trench patterns before and after a shrink method in accordance with the invention.

One wafer was imaged by SEM as a control. The other four wafers were respectively overcoated with one of shrink compositions SC-6, SC-7, SC-8 and SC-9. The compositions gave a film thickness of 825 Å on a blank wafer when coated at 1500 rpm. After overcoating the resist pattern at 1500 rpm, the wafer was soft baked at 150° C. for 60 s. An n-butylacetate rinse was performed, and the patterns were observed using SEM. Representative SEM images of line/space patterns after exposure at 54 mJ before and after the NTD shrink process are shown in FIG. 7, and a plot of CD as a function of dose for the five wafers is shown in FIG. 8.

The amount of shrink varied for the different PS-b-PD-MAEMA-containing shrink compositions, demonstrating the amount of CD shrink can be controlled by tuning the composition and molecular weight of the block copolymer shrink material. FIG. 8 further indicates that the amount of shrink for each PS-b-PDMAEMA material was consistent regardless of the starting feature size.

Example 21

NTD Shrink of Line/Space Patterns

Two negative tone development (NTD) wafers with a pitch of 200 nm and various CDs were prepared using the same lithography process, one as a control and another to undergo an NTD shrink process. The wafers included a 220 Å organosilicon antireflectant layer coated over a 1350 Å organic underlayer. Photoresist Composition 1 was spin-coated to a thickness of 1000 Å followed by a soft bake at 90° C. for 60 s. The resist was then exposed using an ASML 1100 scanner with a numerical aperture (NA) of 0.75 and Dipole-35Y illumination through a line/space reticle with pitch of 200 nm at varying dose across the wafer to form series of a line/space patterns with varying CD. After exposure, a post-exposure bake was performed at 90° C. for 60 s, and the pattern was then developed using n-butyl acetate.

One wafer was observed by SEM as a control. The second wafer was overcoated with shrink composition SC-9. The solution gave a film thickness of 825 Å on a blank wafer when coated at 1500 rpm. After overcoating the NTD lines at 1500 rpm, the wafer was soft baked at 150° C. for 60 s. An n-butyl acetate rinse was then performed, and the patterns were observed using SEM.

Figure 9:
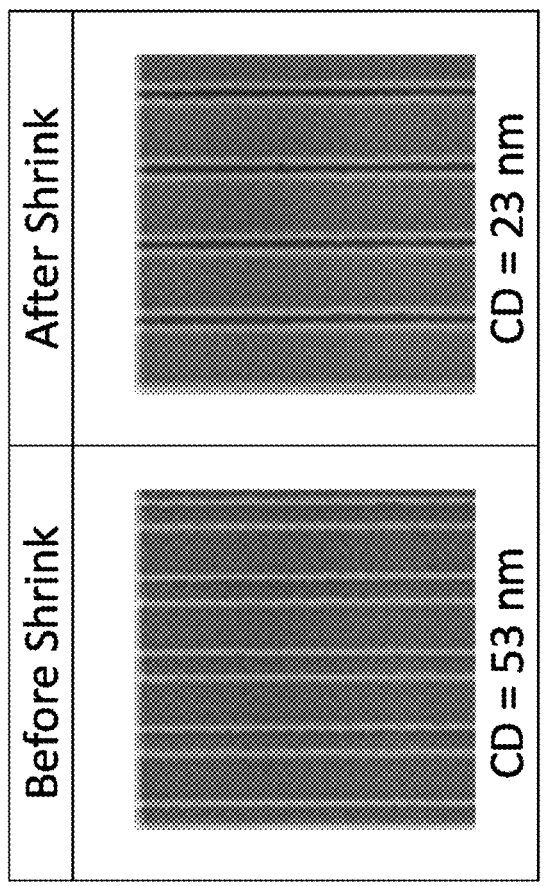
FIG. 9 shows top-down SEM images of line/space patterns before and after a shrink method in accordance with the invention.

FIG. 9 shows representative top-down SEM images of line/space patterns at 100 nm CD and 200 nm pitch after exposure at 61 mJ before and after the NTD shrink process. The NTD pattern exposed at a dose of 61 mJ was shrunk to a clean trench of only 23 nm under these conditions.

Example 22

NTD Shrink of Contact Hole Patterns

Four negative tone development (NTD) wafers with contact hole patterns at a pitch of 300 nm and various critical dimension (CD) were prepared using the same lithography process, one as a control and others to undergo NTD shrink processes. The wafers included a 220 Å organosilicon antireflectant layer coated over a 1350 Å organic underlayer. Photoresist Composition 1 was spin-coated to a thickness of 1000 Å followed by a soft bake at 90° C. for 60 s. The resist was then exposed using an ASML 1100 scanner with a numerical aperture (NA) of 0.75 and Quadrapole 30 illumination through a contact hole reticle with pitch of 300 nm at varying dose across the wafer to form series of contact holes with varying CD. After exposure, a post-exposure bake was performed at 90° C. for 60 s, and the pattern was then developed using n-butyl acetate.

Figure 10:
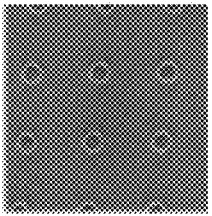
FIG. 10 shows top-down SEM images of contact hole patterns before and after a shrink method in accordance with the invention.
Figure 11:
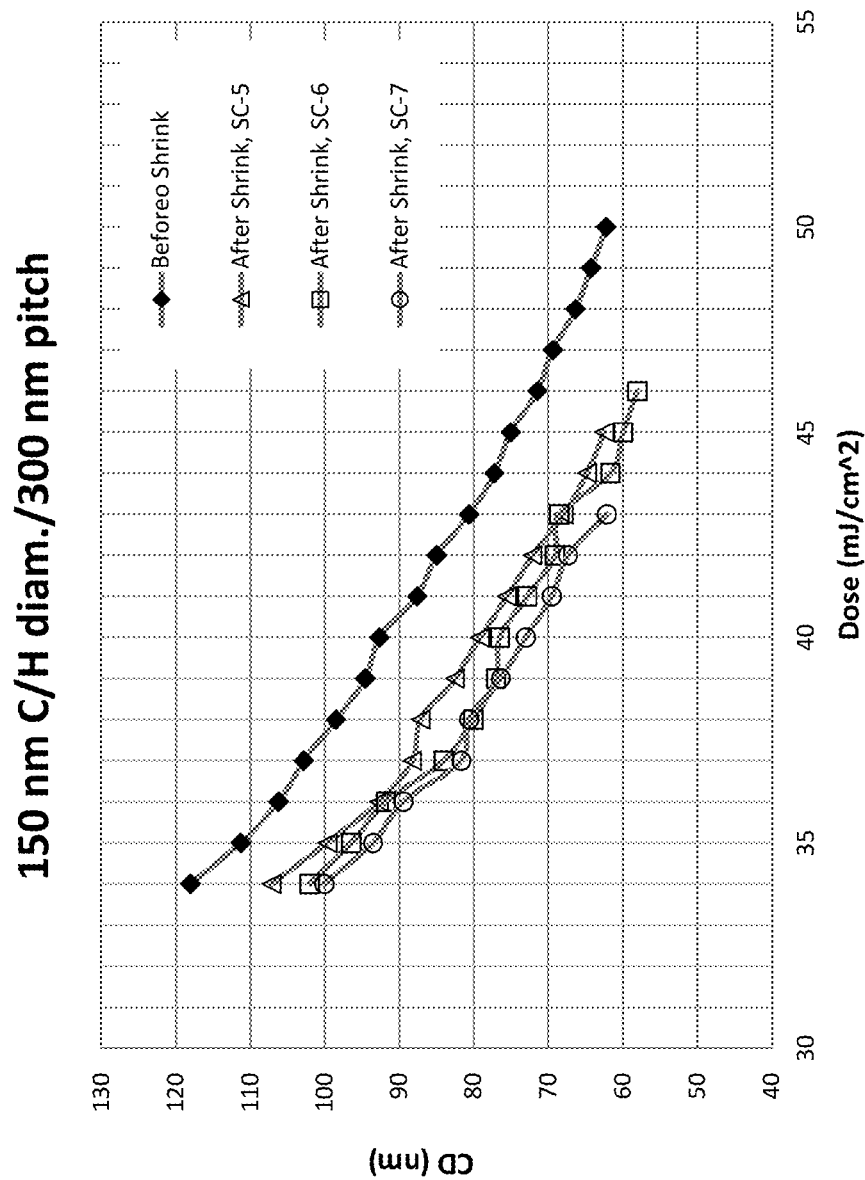
FIG. 11 is a plot of CD as a function of dose for contact hole patterns before and after a shrink method in accordance with the invention.

One wafer was observed by SEM as a control. The other three wafers were respectively overcoated with shrink compositions SC-6, SC-7 and SC-8. The compositions gave a film thickness of 825 Å on a blank wafer when coated at 1500 rpm. After overcoating the NTD resist pattern at 1500 rpm, the wafer was soft baked at 150° C. for 60 s. An n-butyl acetate rinse was then performed, and the patterns were observed using SEM. Representative top-down SEM images of contact hole patterns printed at 300 nm pitch before and after the NTD shrink process are shown in FIG. 10. FIG. 11 is a plot of CD as a function of dose from SEM images of contact hole patterns before and after the NTD shrink process, showing consistent CD change regardless of starting CD for each material.

Figure 12:
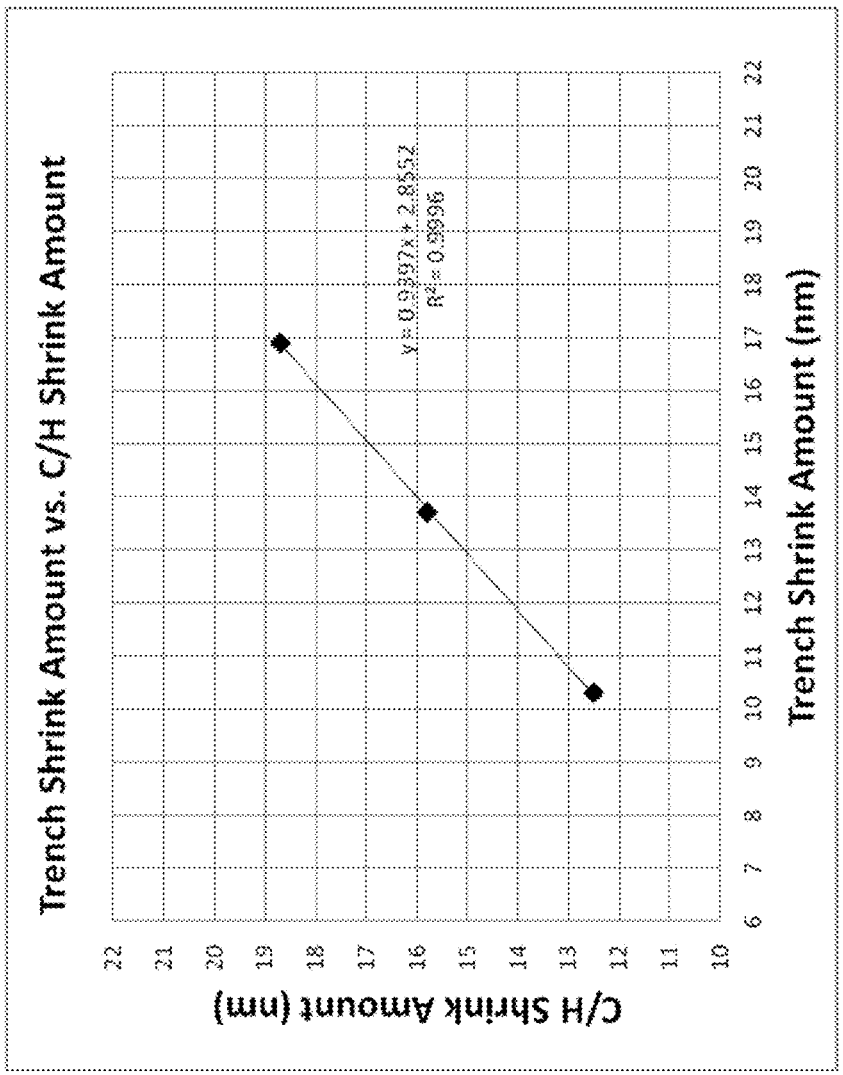
FIG. 12 is a comparison plot of CD shrink amount for line/space and contact hole patterns formed in accordance with the invention.

FIG. 10 shows that the amount of shrink was variable for the different PS-b-PDMAEMA-containing shrink compositions, demonstrating the amount of CD shrink can be controlled by tuning the composition and molecular weight of the block copolymer shrink material. FIG. 11, which is a plot of CD as a function of dose from SEM images of contact hole patterns before and after the NTD shrink process, also shows the amount of shrink is consistent regardless of the starting feature size. FIG. 12 is a comparison plot of CD shrink amount for line/space and contact hole patterns comparing the CD shrink amount of line/space patterns from Example 20 and contact hole patterns from Example 22 after processing with shrink compositions SC-6, SC-7 and SC-8. The linear relationship and near unity value of the x-factor in the line fit indicate the shrink is consistent regardless of feature type for this process.

Example 23

NTD Shrink of Contact Hole Patterns

Four NTD wafers with contact hole patterns at a pitch of 90 nm and a CD of ~60 nm were prepared using the same lithography process, one as a control and others to undergo NTD shrink processes. 300 mm silicon wafers were spin-coated with AR™40A antireflectant (Rohm and Haas Electronic Materials) to form a first BARC layer on a TEL CLEAN TRAC LITHIUS i+ coater/developer. The wafer was baked for 60 seconds at 205° C., yielding a first BARC film with a thickness of 800 Å. A second BARC layer was coated over the first BARC using AR™104 antireflectant (Rohm and Haas Electronic Materials), and was baked at 175° C. for 60 seconds to generate a 400 Å top BARC layer. Photoresist Composition 2 was spin-coated on the dual BARC-coated wafers and soft-baked at 90° C. for 60 seconds on a TEL CLEAN TRACK LITHIUS i+ coater/developer to provide a resist layer with a thickness of ~800 Å. The wafers were exposed through a mask on an ASML TWINSCAN XT:1900i immersion scanner using CQUAD illumination condition with 1.35 NA, 0.85 outer sigma and 0.72 inner sigma. The exposed wafers were post-exposure baked at 100° C. for 60 seconds and then developed using OSD™1000 (Rohm and Haas Electronic Materials) developer for 25 seconds on a TEL CLEAN TRACK™ LITHIUS™i+ coater/developer to give negative tone contact hole patterns with a 90 nm pitch.

One wafer was observed by SEM as a control. The other three wafers were respectively overcoated with shrink compositions SC-1, SC-2 and SC-3. The compositions were disposed on the resist patterns by spin coating at 1500 rpm, and the wafer was soft baked at 150° C. for 120 s. A rinse with 4-methyl-2-pentanol was performed, and the patterns were observed using SEM and analyzed using ImageJ software.

FIG. 13 shows SEM images before shrink (FIG. 13A), and after shrink using NTD shrink compositions SC-1 (FIG. 13B), SC-2 (FIG. 13C) and SC-3 (FIG. 13D). The CDs of the holes for each are shown in Table 3, demonstrating that the NTD shrink process resulted in smaller contact holes. The amount of shrink was different for the three shrink materials, demonstrating the amount of CD shrink can be controlled by tuning the composition and molecular weight of the block copolymer shrink material. Shrink composition SC-3, containing block copolymer PTBMA-b-PDMAEMA (1), exhibited a very large shrink amount.

TABLE 3

| Shrink Comp. | NTD Shrink Polymer | CD (nm) | Shrink Amount (nm) |
|---|---|---|---|
| — | — | 62.4 | — |
| SC-1 | P(NPMA-ran-DMAEMA) | 54.3 | 8.1 |
| SC-2 | P(NPMA-ran-TBAEMA) | 57.2 | 5.2 |
| SC-3 | PTBMA-b-PDMAEMA-1 | 24.7 | 37.7 |

Example 24

NTD Shrink of Contact Hole Patterns 300 mm silicon wafers were spin-coated with AR™40A antireflectant (Rohm and Haas Electronic Materials) to form a first BARC layer on a TEL CLEAN TRAC LITHIUS i+ coater/developer. The wafer was baked for 60 seconds at 205° C., yielding a first BARC film with a thickness of 800 Å. A second BARC layer was coated over the first BARC using AR™104 antireflectant (Rohm and Haas Electronic Materials), and was baked at 175° C. for 60 seconds to generate a 400 Å top BARC layer. Photoresist Composition 2 was spin-coated on the dual BARC-coated wafers and soft-baked at 90° C. for 60 seconds on a TEL CLEAN TRACK LITHIUS i+ coater/developer to provide a resist layer with a thickness of ~800 Å. The wafers were exposed through a mask on an ASML TWINSCAN XT:1900i immersion scanner using CQUAD illumination condition with 1.35 NA, 0.85 outer sigma and 0.72 inner sigma. The exposed wafers were post-exposure baked at 100° C. for 60 seconds and developed using OSD™1000 developer (Rohm and Haas Electronic Materials) for 25 seconds on a TEL CLEAN TRACK™ LITHIUS™ i+ coater/developer to give negative tone contact hole patterns with a 90 nm pitch.

NTD shrink compositions SC-10, SC-11 and SC-12 were coated on respective NTD patterned wafers by spin-coating. The coated wafers were annealed at 90° C. (SC-10) or 100° C. (SC-11 and SC-12) for 60 seconds to remove residual solvent and induce grafting of the shrink composition polymers onto the photoresist pattern. Residual shrink composition was removed by rinsing with 2-heptanone (SC-9) or heptane (SC-10 and SC-11). Representative top-down SEM images of contact hole patterns before and after the NTD shrink process are provided in FIG. 14A-D. CDs of contact holes before and after the shrink treatment were measured and varied from 6 to 8.3 nm.

Figure 14:
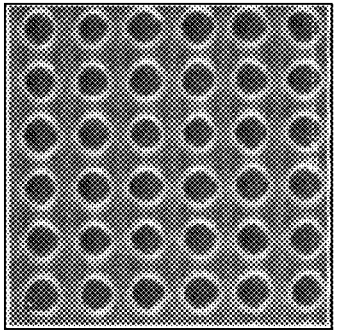
FIG. 14 shows top-down SEM images of contact hole patterns before and after a shrink method in accordance with the invention.
Figure 14:
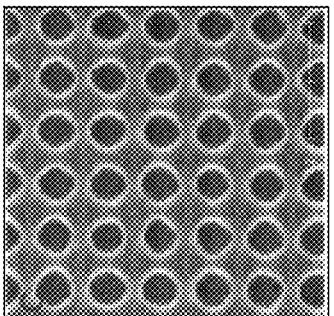
Figure 14:
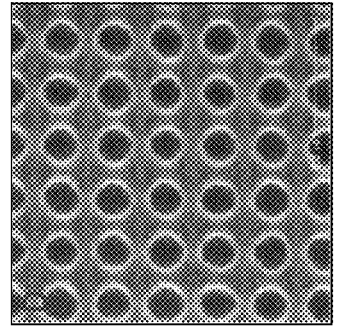
Figure 14:
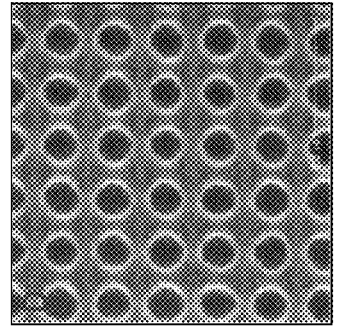

FIG. 14 shows SEM images before shrink (FIG. 14A), and after shrink using NTD shrink compositions SC-10 (FIG. 14B), SC-11 (FIG. 14C) and SC-12 (FIG. 14D). The CDs of the holes for each are shown in Table 4, with the NTD shrink process resulting in smaller holes for each of the shrink compositions.

TABLE 4

| Shrink Comp. | NTD Shrink Polymer | CD (nm) | Shrink Amount (nm) |
|---|---|---|---|
| — | — | 60.5 | — |
| SC-10 | AMS-2202 | 52.2 | 8.3 |
| SC-11 | AMS-152 | 54.5 | 6.0 |
| SC-12 | AMS-233 | 53.1 | 7.4 |

What is claimed is:
1. A pattern shrink method, comprising:
   (a) providing a semiconductor substrate comprising one or more layers to be patterned;
   (b) providing a resist pattern over the one or more layers to be patterned;
   (c) coating a shrink composition over the pattern, wherein the shrink composition comprises a polymer and an organic solvent, wherein the polymer comprises a group containing a hydrogen acceptor effective to form a bond with an acid group and/or an alcohol group at a surface of the resist pattern, wherein the group containing the hydrogen acceptor is an oxygen-containing group or a nitrogen-containing group chosen from primary amine, amide, pyridine, indole, imidazole, triazine, pyrrole, purine, diazetidine, dithiazine, quinoline, carbazole, acridine, indazole, and benzimidazole groups; and wherein the composition is free of cross-linkers; and
   (d) rinsing residual shrink composition from the substrate, leaving a portion of the polymer bonded to the resist pattern.
2. The pattern shrink method of claim 1, wherein providing the resist pattern comprises:
   (b1) applying a layer of a photoresist composition over the one or more layers to be patterned, wherein the photoresist composition comprises: a polymer comprising an acid cleavable leaving group, the cleavage of which forms an acid group and/or an alcohol group; a photoacid generator; and a solvent;
   (b2) exposing the photoresist layer to activating radiation through a patterned photomask;
   (b3) heating the photoresist layer, wherein acid generated by the acid generator causes cleavage of the acid cleavable leaving group, thereby forming the acid group and/or the alcohol group;
   (b4) developing the exposed photoresist composition layer with an organic solvent developer to form a negative resist pattern comprising the acid group and/or the alcohol group.
3. The pattern shrink method of claim 1, wherein the group containing the hydrogen acceptor group is a nitrogen-containing group.
4. The pattern shrink method of claim 3, wherein the group containing the hydrogen acceptor group is a primary amine.
5. The pattern shrink method of claim 1, wherein the group containing the hydrogen acceptor is an oxygen-containing group.
6. The pattern shrink method of claim 1, wherein the polymer further comprises a unit formed from a vinyl aromatic monomer.
7. The pattern shrink method of claim 1, wherein the polymer further comprises a unit formed from an (alkyl) acrylate monomer.
8. The pattern shrink method of claim 7, wherein the (alkyl)acrylate monomer is of general formula (5):

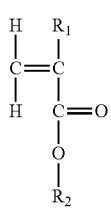

(5)

wherein $R_1$ is a hydrogen or an alkyl group having 1 to 10 carbon atoms; and $R_2$ is a $C_1$-$C_{10}$ alkyl, a $C_3$-$C_{10}$ cycloalkyl, or a $C_7$-$C_{10}$ aralkyl group.

9. The pattern shrink method of claim 1, wherein the polymer contains silicon.

10. The pattern shrink method of claim 1, wherein the polymer comprises a block polymer comprising a first block and a second block.

11. The pattern shrink method of claim 10, wherein the first block forms an ionic bond with an acid group or a hydrogen bond with an alcohol group of the resist pattern.

12. The pattern shrink method of claim 10, wherein the second block has a $T_g$ that is lower than a reflow temperature of the resist pattern.

13. The pattern shrink method of claim 1, wherein the polymer has an Ohnishi parameter lower than 3.5, or a silicon content greater than 15 wt % based on the polymer.

14. The pattern shrink method of claim 1, further comprising baking the substrate after the rinsing.

15. The pattern shrink method of claim 1, wherein the group containing the hydrogen acceptor is a pyridine group.

16. The pattern shrink method of claim 15, wherein the pyridine group is present in the polymer as a unit formed from 2-vinylpyridine.

17. The pattern shrink method of claim 15, wherein the pyridine group is present in the polymer as a unit formed from 4-vinylpyridine.

18. A pattern shrink method, comprising:
(a) providing a semiconductor substrate comprising one or more layers to be patterned;
(b) providing a resist pattern over the one or more layers to be patterned;
(c) coating a shrink composition over the pattern, wherein the shrink composition comprises a polymer and an organic solvent, wherein the polymer comprises a group containing a hydrogen acceptor, wherein the group containing the hydrogen acceptor comprises a nitrogen-containing group chosen from primary amine, amide, pyridine, indole, imidazole, triazine, pyrrole, purine, diazetidine, dithiazine, quinoline, carbazole, acridine, indazole, and benzimidazole; and wherein the composition is free of crosslinkers; and
(d) rinsing residual shrink composition from the substrate, leaving a portion of the polymer on the resist pattern, thereby shrinking a spacing of the resulting pattern.

19. The pattern shrink method of claim 18, wherein providing the resist pattern comprises:
(b1) applying a layer of a photoresist composition over the one or more layers to be patterned, wherein the photoresist composition comprises: a polymer comprising an acid cleavable leaving group, the cleavage of which forms an acid group and/or an alcohol group; a photoacid generator; and a solvent;
(b2) exposing the photoresist layer to activating radiation through a patterned photomask;
(b3) heating the photoresist layer, wherein acid generated by the acid generator causes cleavage of the acid cleavable leaving group, thereby forming the acid group and/or the alcohol group;
(b4) developing the exposed photoresist composition layer with an organic solvent developer to form a negative resist pattern comprising the acid group and/or the alcohol group.

20. The pattern shrink method of claim 18, wherein polymer further comprises a unit formed from a vinyl aromatic monomer.

21. The pattern shrink method of claim 18, wherein the polymer further comprises a unit formed from an (alkyl) acrylate monomer.

22. The pattern shrink method of claim 18, wherein the polymer contains silicon.

23. The pattern shrink method of claim 18, wherein the polymer comprises a block polymer comprising a first block and a second block.

24. The pattern shrink method of claim 18, wherein the group containing the hydrogen acceptor group is a primary amine.

25. The pattern shrink method of claim 18, wherein the group containing the hydrogen acceptor is a pyridine group.

26. The pattern shrink method of claim 25, wherein the pyridine group is present in the polymer as a unit formed from 2-vinylpyridine.

27. The pattern shrink method of claim 25, wherein the pyridine group is present in the polymer as a unit formed from 4-vinylpyridine.

28. A pattern shrink method, comprising:
(a) providing a semiconductor substrate comprising one or more layers to be patterned;
(b) providing a resist pattern over the one or more layers to be patterned, wherein the resist pattern is formed by a negative tone development process;
(c) coating a shrink composition over the pattern, wherein the shrink composition comprises a block polymer and an organic solvent, wherein the block polymer comprises a first block and a second block, and the first block comprises a group containing a hydrogen acceptor, wherein the group containing the hydrogen acceptor comprises a nitrogen-containing group chosen from primary amine, amide, pyridine, indole, imidazole, triazine, pyrrole, purine, diazetidine, dithiazine, quinoline, carbazole, acridine, indazole, and benzimidazole; and wherein the composition is free of crosslinkers; and
(d) rinsing residual shrink composition from the substrate, leaving a portion of the polymer on the resist pattern, thereby shrinking a spacing of the resulting pattern.

29. The pattern shrink method of claim 28, wherein providing the resist pattern comprises:
(b1) applying a layer of a photoresist composition over the one or more layers to be patterned, wherein the photoresist composition comprises: a polymer comprising an acid cleavable leaving group, the cleavage of which forms an acid group and/or an alcohol group; a photoacid generator; and a solvent;
(b2) exposing the photoresist layer to activating radiation through a patterned photomask;
(b3) heating the photoresist layer, wherein acid generated by the acid generator causes cleavage of the acid cleavable leaving group, thereby forming the acid group and/or the alcohol group;
(b4) developing the exposed photoresist composition layer with an organic solvent developer to form a negative resist pattern comprising the acid group and/or the alcohol group.

30. The pattern shrink method of claim 28, wherein the second block of the block polymer comprises a unit formed from a vinyl aromatic monomer.

31. The pattern shrink method of claim 28, wherein the block polymer further comprises a unit formed from an (alkyl)acrylate monomer.

32. The pattern shrink method of claim 28, wherein the block polymer contains silicon.

33. The pattern shrink method of claim 28, wherein the group containing the hydrogen acceptor group is a primary amine.

34. The pattern shrink method of claim 28, wherein the group containing the hydrogen acceptor is a pyridine group.

35. The pattern shrink method of claim 34, wherein the pyridine group is present in the polymer as a unit formed from 2-vinylpyridine.

36. The pattern shrink method of claim 34, wherein the pyridine group is present in the polymer as a unit formed from 4-vinylpyridine.

* * * * *